US010879394B2

(12) United States Patent
Yeh et al.

(10) Patent No.: US 10,879,394 B2
(45) Date of Patent: Dec. 29, 2020

(54) SEMICONDUCTOR DEVICE AND METHOD OF FORMING THE SAME

(71) Applicant: TAIWAN SEMICONDUCTOR MANUFACTURING CO., LTD., Hsinchu (TW)

(72) Inventors: Ling-Yen Yeh, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/503,357

(22) Filed: Jul. 3, 2019

(65) Prior Publication Data

US 2020/0044084 A1  Feb. 6, 2020

Related U.S. Application Data

(60) Provisional application No. 62/712,842, filed on Jul. 31, 2018.

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/02532* (2013.01); *H01L 21/02603* (2013.01);
(Continued)

(58) Field of Classification Search
CPC ............... H01L 29/7848; H01L 29/785; H01L 29/78618; H01L 29/78696;
(Continued)

(56) References Cited

U.S. PATENT DOCUMENTS 9,209,247 B2  12/2015 Colinge et al.
9,236,267 B2   1/2016 De et al.
(Continued)

OTHER PUBLICATIONS

S. J. Pearton et al., "Plasma etching of ZnS, ZnSe, CdS, and CdTe in electron cyclotron resonance CH4/H2/Ar and H2/Ar discharges", Journal of Vacuum Science & Technology B, (1993), 15-19.
(Continued)

*Primary Examiner* — Dao H Nguyen
(74) *Attorney, Agent, or Firm* — Maschoff Brennan

(57) ABSTRACT

A stack is formed on a substrate. The stack includes plural first epitaxial layers and plural second epitaxial layers alternatingly stacked over each other. The first epitaxial layers include sulfur, phosphorous, selenium, arsenic, or combinations thereof. A first etching process is performed on the stack to form a fin. A dielectric layer is formed over the fin. A channel region of the fin is exposed. A second etching process is performed on a first portion of each of the first epitaxial layers in the channel region of the fin using a hydrocarbon etch chemistry. The second etching process etches the first epitaxial layers at a higher etch rate than the second etching process etches the second epitaxial layers. A gate structure is formed around a first portion of each of the second epitaxial layers in the channel region of the fin.

20 Claims, 33 Drawing Sheets

(51) Int. Cl.
*H01L 29/423* (2006.01)
*H01L 21/8238* (2006.01)
*H01L 21/02* (2006.01)
*H01L 27/092* (2006.01)

(52) U.S. Cl.
CPC ............... *H01L 21/823807* (2013.01); *H01L 21/823814* (2013.01); *H01L 21/823821* (2013.01); *H01L 27/0924* (2013.01); *H01L 29/42392* (2013.01); *H01L 29/66545* (2013.01); *H01L 29/66795* (2013.01); *H01L 29/785* (2013.01)

(58) Field of Classification Search
CPC ......... H01L 20/66795; H01L 29/66545; H01L 20/66553; H01L 21/823814; H01L 21/823821; H01L 21/02603; H01L 21/02532; H01L 21/02507; H01L 27/0924; H01L 27/092
USPC ............... 438/163, 197, 198, 151, 157, 694; 257/347, 368, 369, 401, 288, 192, 257/E21.421, E21.561, E29.168
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,653,289 B1 * | 5/2017 | Balakrishnan ........ H01L 27/088 |
| 10,074,575 B1 * | 9/2018 | Guillorn ............ H01L 29/0673 |
| 10,263,100 B1 * | 4/2019 | Bi .......................... B82Y 10/00 |
| 2017/0194143 A1 * | 7/2017 | Balakrishnan .... H01L 21/82343 |
| 2017/0323941 A1 * | 11/2017 | Obradovic .......... H01L 29/0847 |
| 2018/0102359 A1 * | 4/2018 | Cheng ............... H01L 29/66772 |
| 2019/0067441 A1 * | 2/2019 | Yang .................. H01L 29/1079 |

OTHER PUBLICATIONS

K, Ohtsuka et al., "Reactive ion etching of ZnSe by gas mixture of ethane and hydrogen", Applied physics letters 60 (24), (1992), 3025-3026.

J. W. Lee et al., "High Ion Densily Plasma Etching of InGaP, AlInP, and AlGaP in CH4/H2/Ar", J. Electrochem. Soc., vol. 143, No. 3, (1996) 1093-1098.

Geoffrey A. Landis et al., "Deposition and characterization of ZnS/Si heterojunctions produced by vacuum evaporation", Fifth North Coast American Vacuum Society Symposium Cleveland, Ohio, 1988.

Ch. Maierhofer et al., "Valence band offset in ZnS layers on Si(111) grown by molecular beam epitaxy", J. Vac. Sci. Technol. B 9 (4), (1991), 2238-2243.

S. Barraud et al., "Vertically stacked-NanoWires MOSFETs in a replacement metal gate process with inner spacer and SiGe source/drain", IEEE, (2016), IEDM16, 464-467.

D. A. Cammack et al., "Electron beam pumped lasing in ZnSe/ZnSSe superlattice structuresn grown by molecular-beam epitaxy", J. Appl. Phys. 62 (7), (1987), 3071-3074.

Yasuhide Kuroda et al., "Optical and structural characterizations of ZnSe/ZnSSe superlattices grown by metalorganic chemical vapor deposition", J. Appl. Phys. 72 (7), (1992), 3029-3033.

J.P. Dismukes et al., "Thermal and Electrical Properties of Heavily Doped Ge—Si Alloys up to 1300° K.", Journal of Applied Physics vol. 35, (1964), 2899-2907.

* cited by examiner

SEMICONDUCTOR DEVICE AND METHOD OF FORMING THE SAME

PRIORITY CLAIM AND CROSS-REFERENCE

This application claims priority to U.S. Provisional Application Ser. No. 62/712,842, filed on Jul. 31, 2018, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region formed by nanowires, providing access to the channel region on all sides. The HGAA transistors are compatible with conventional complementary metal-oxide-semiconductor (CMOS) processes, allowing them to be aggressively scaled down while maintaining gate control and mitigating SCEs. However, fabrication of the HGAA transistors can be challenging, in particular the formation of nanowires.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
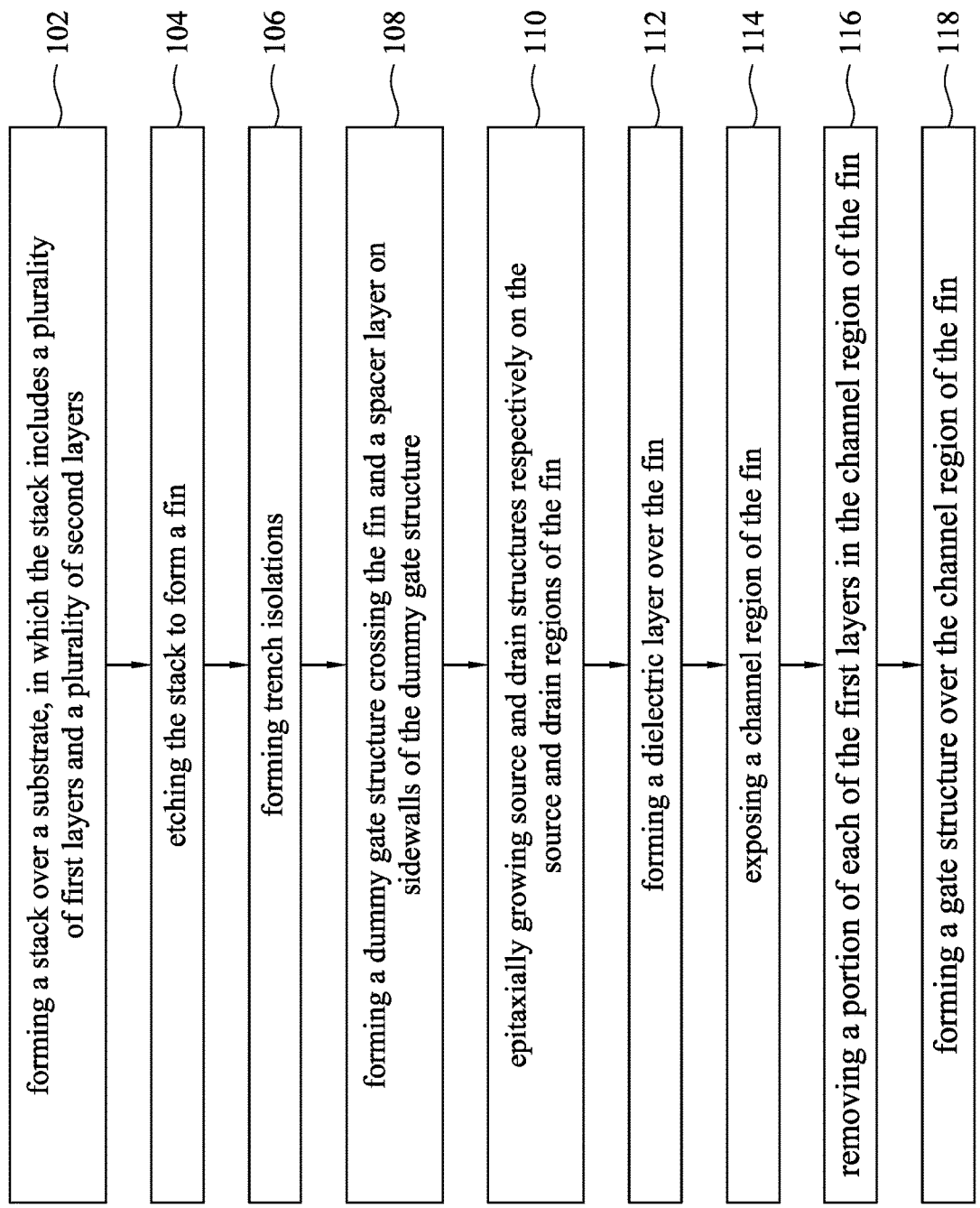
FIG. 1 is a flow chart of a method 100 of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Channel materials may be silicon (Si) for an n-type field effect transistor (nFET) device and silicon germanium ($Si_{1-a}Ge_a$) for a p-type field effect transistor (pFET) device. Si nanowires are formed by removing $Si_{1-a}Ge_a$ in a $Si/Si_{1-a}Ge_a$ stack, and $Si_{1-a}Ge_a$ nanowires are formed by removing Si in the $Si/Si_{1-a}Ge_a$ stack. However, the nature of Si and $Si_{1-a}Ge_a$ is similar, especially when a germanium content (i.e. the "a" of $Si_{1-a}Ge_a$) is less than about 0.3. In addition, a transition layer of $Si_{1-b}Ge_b$ may be formed between Si and $Si_{1-a}Ge_a$ where b is a germanium content of $Si_{1-b}Ge_b$. The "b" is not a fix number and may be gradually decreasing from the value of "a" at the $Si_{1-a}Ge_a$ side to 0 at the Si side, where $0<b<a$. Due to the similar natures of Si and $Si_{1-a}Ge_a$ and an uncertainty of the existence of the transition layer, a problem such as insufficient etch selectivity for forming the nanowires may occur, causing great loss of the nanowires (e.g. greater than 1 nm).

Although increasing the germanium content of $Si_{1-a}Ge_a$ may improve the etch selectivity, a strain is generated by the lattice mismatch in the $Si/Si_{1-a}Ge_a$ layers due to a difference of lattice constants between $Si/Si_{1-a}Ge_a$, and the difference increases with the increasing germanium content. Therefore, the germanium content of $Si_{1-a}Ge_a$ is limited due to the concern of the strain. In addition, strain relaxation caused by the greater germanium content of $Si_{1-a}Ge_a$ may lead to imperfections (e.g. dislocation) in the stack. Therefore, a thickness $Si_{1-a}Ge_a$ in the $Si/Si_{1-a}Ge_a$ stack and a number of the nanowires are limited by the germanium content. This further increases the difficulties of fabricating the nanowires.

Embodiments of the present disclosure are directed to providing a semiconductor device and a method of forming the semiconductor device. A stack including layers such as silicon, silicon germanium ($Si_{1-a}Ge_a$, and hereinafter abbreviated as SiGe) or germanium and layers (may be referred to as sacrificial layers) having a lattice constant equal to or substantially equal to (e.g. a lattice constant difference is less than 5%) Si, SiGe or Ge are used to fabricate nanowires, in which the sacrificial layers may include $Si_{1-x}Ge_x$, $ZnS_{1-x}Se_x$, $Al_{1-x}Ga_xP$, $GaP_{1-x}As_x$, $MgS_{1-x}Se_x$, or $Al_{1-x}Ga_xAs$, where x is greater than or equal to 0 and smaller than or equal to 1. An etching operation of at least partially removing the sacrificial layers has a high selectivity of the sacrificial layers with respect to the Si, SiGe, or Ge layers, and thus nanowires of the Si, SiGe, or Ge layers may be formed without being damaged. Furthermore, the sacrificial layers may be used as buffer layers being disposed between every two immediately adjacent layers of a typical Si/SiGe (or any two of Si, SiGe and Ge) stack. Removal of the buffer layers forms a space between every two immediately adjacent layers, and thus a transition layer may be reduced or may not be exist. Accordingly, the limitation caused by the lattice mismatch and the transition layer in any two of Si, SiGe and Ge stack can be avoided.

Figure 2B:
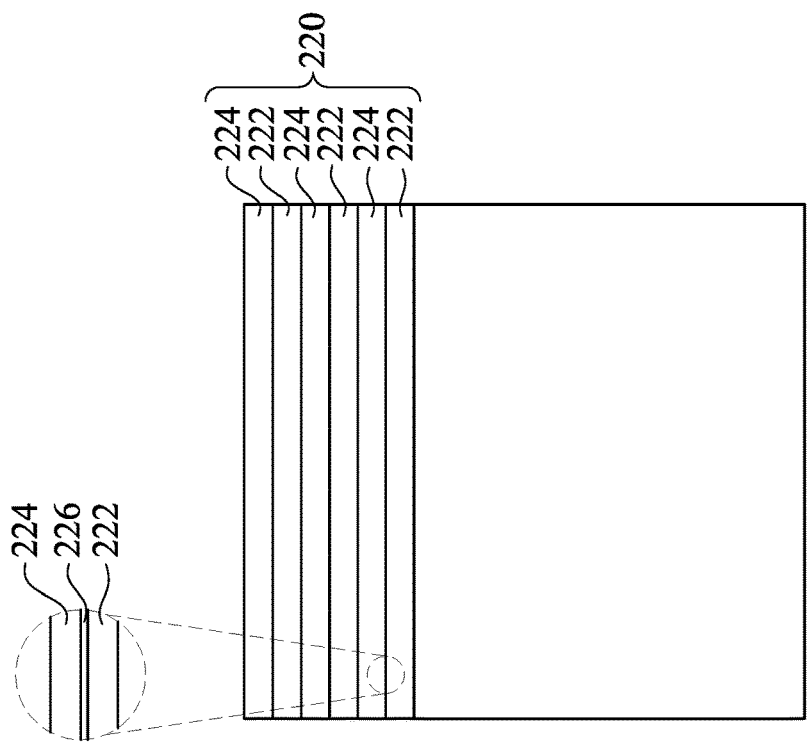
FIG. 2A through FIG. 7 show various stages of a method for forming a semiconductor device in accordance with some embodiments of the present disclosure.
Figure 2A:
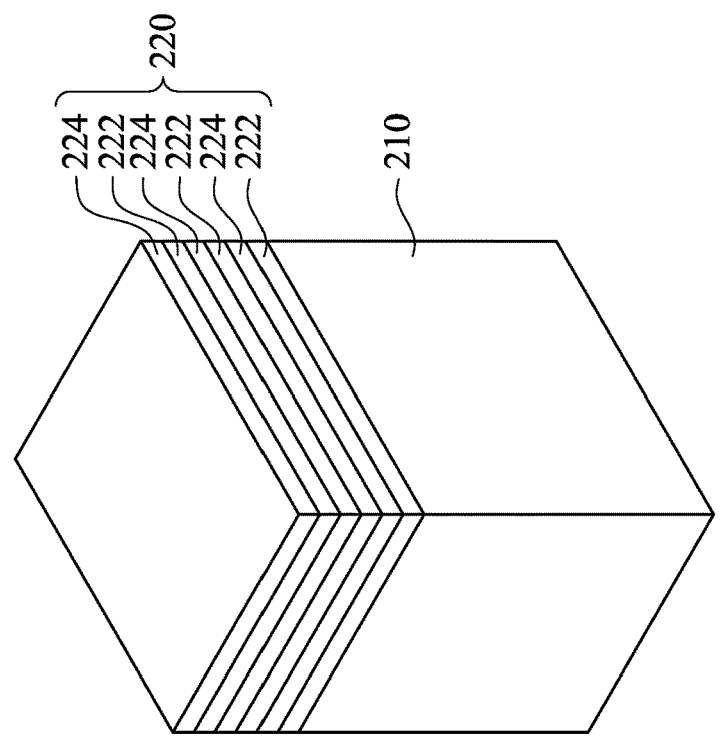

FIG. 1 is a flow chart of a method of forming a semiconductor device in accordance with some embodiments of the present disclosure. FIG. 2A through FIG. 7 show various stages of a method for forming a semiconductor device in accordance with some embodiments of the present disclosure. Please refer to FIG. 1, FIG. 2A and FIG. 2B, in which FIG. 2B is a cross sectional view of FIG. 2A. At operation 102, a substrate 210 is provided. A stack 220 including plural first layers 222 and plural second layers 224 is formed on the substrate 210. In some embodiments, the substrate 210 includes a crystalline silicon substrate (e.g. a wafer). The substrate 210 may include various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the substrate 210 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 210 may include an epitaxial layer (epi-layer), may be strained for performance enhancement, and/or may include a silicon-on-insulator (SOI) structure.

In some embodiments, the first layers 222 and the second layers 224 are alternately stack on each other. The first layers 222 have an etching selectivity with respect to the second layers 224 (e.g. the main composition of the first layers 222 is different from that of the second layers 224). Furthermore, a lattice constant difference between the first layers 222 and the second layers 224 is equal to or less than about 5% (i.e. the lattice constant of each of the first layers 222 is equal to or substantially equal to the lattice constant of each of the second layers 224). If the lattice constant difference is greater than 5%, strain may occur in the stack 220. In some embodiments, each of the first layers 222 includes $ZnS_{1-x}Se_x$, $Al_{1-x}Ga_xP$, $GaP_{1-x}As_x$, $MgS_{1-x}Se_x$, or $Al_{1-x}Ga_xAs$, where x is greater than or equal to 0 and smaller than or equal to 1, and each of the second layers 224 includes silicon (Si), silicon germanium (SiGe) or germanium (Ge). For example, the first layers 222 may be formed from $ZnS_{1-x}Se_x$ having a lattice constant A obtained from the following formula (1). The second layers 224 may be formed from $Si_{1-a}Ge_a$ having a lattice constant B obtained from the following formula (2), in which "a" is greater than or equal to 0 and smaller than or equal to 1. In other words, the Se content of the first layers 222 increases with the increase of the germanium content of the second layers 224, so as to form the first layers 222 having a lattice constant equal to or substantially equal to the lattice constant of the second layers 224. In some embodiments, a transition layer 226 may be formed on an interface between each of the second layers 224 and each of the first layers 222, as shown the enlargement portion of FIG. 2B. However, the transition layer 226 may be much thinner than the transition layer formed in the typical $Si/Si_aGe_{1-a}$ stack.

$$A \text{ (nm)}=0.028 \times x+0.54 \tag{1}$$

$$B \text{ (nm)}=0.5431+0.02a+0.0027a^2 \tag{2}$$

In some embodiments, the second layers 224 are formed from silicon, and the first layers 222 are formed from ZnS, AlP or GaP. In some other embodiments, the second layers 224 are formed from SiGe, and the first layers 222 are formed from $ZnS_{1-x}Se_x$, $GaP_{1-x}As_x$ or combinations thereof, where x is greater than 0 and smaller than 1. In some still other embodiments, the second layers 224 are formed from germanium, and the first layers 222 are formed from MgS, AlAs, ZnSe or GaAs. In some embodiments, each of the second layers 224 and the first layers 222 respectively has a thickness in a range substantially from 2 nm to 15 nm. In some embodiments, the stack 220 of the first layers 222 and the second layers 224 has a thickness in a range substantially smaller than or equal to 100 nm and greater than 4 nm. Because the stack 220 is formed from the first layers 222 having the lattice constant equal to or substantially equal to the lattice constant of the second layers 224, strain and lattice mismatch may be prevented, such that the thickness of the stack 220, the thickness of each of the first layers 222 and the second layers 224, and/or the number of pairs of the first layers 222/the second layers 224 in the stack 220 is not limited by the factors such as strain and lattice mismatch. In other words, without strain and lattice mismatch, the thickness of the stack 220 of the present disclosure is not limited, and thus may be thicker than a typical stack used to form nanowires.

In some embodiments, each of the first layers 222 and the second layers 224 is epitaxially grown on its underlying layer. The epitaxially growth may be performed by low pressure chemical vapor deposition (LPCVD), metal-organic chemical vapor deposition (MOCVD), molecular beam epitaxy (MBE), vapor phase epitaxy (VPE), Ultrahigh vacuum CVD (UHVCVD), vacuum evaporation deposition, the like, or a combination thereof. In some embodiments, the second layers 224 are formed from silicon by LPCVD process performed at a temperature of about 400° C. to about 750° C. and under a pressure of about 10 torr to about 200 torr, using $SiH_2Cl_2$ or $SiH_4$ as reaction gases. In some embodiments, the second layers 224 are formed from SiGe by LPCVD at a temperature of about 400° C. to about 800° C. and under a pressure of about 1 to about 200 torr, using $SiH_2Cl_2$ or $SiH_4$, $GeH_4$, and HCl or $H_2$ as reaction gases. In some other embodiments, the first layers 222 are formed from ZnS by vacuum evaporation deposition under a temperature in a range substantially from about 450° C. to about 575° C. In some embodiments, the first layers 222 may be formed by MOCVD using diethylzinc (DEZn), diethylselenide and diethylsulfide. In some embodiments, the first layers 222 may be formed by MBE using ZnSe source accompanied with $ZnS_{0.5}Se_{0.5}$ source, and the growth rate may be about 0.3 to about 0.65 μm/hour.

Figure 3A:
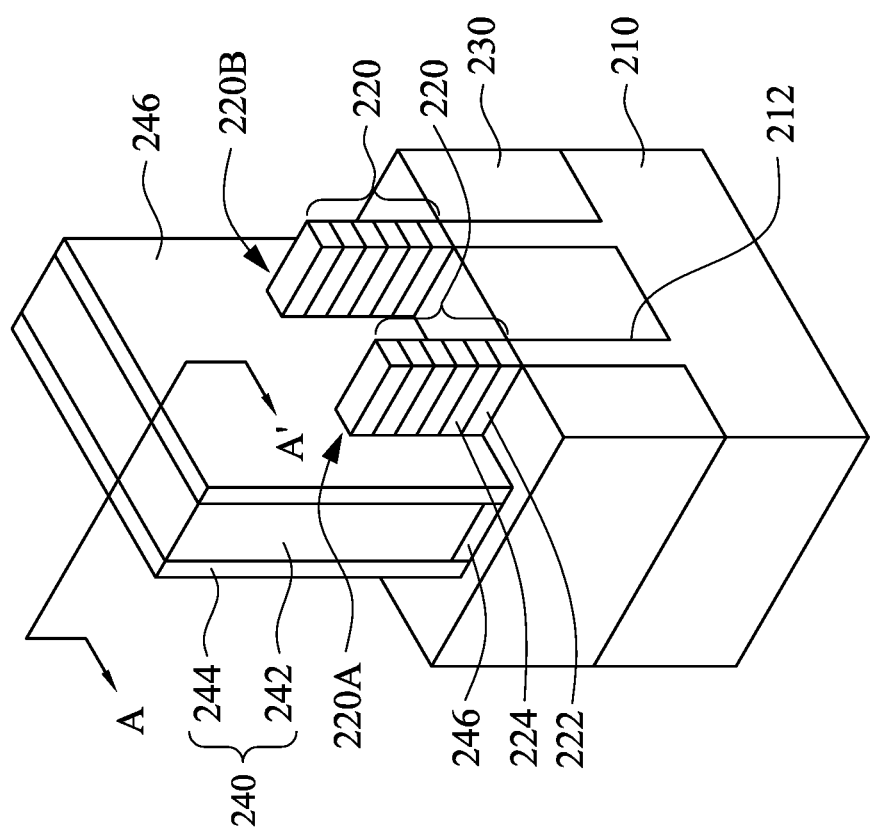
Figure 3B:
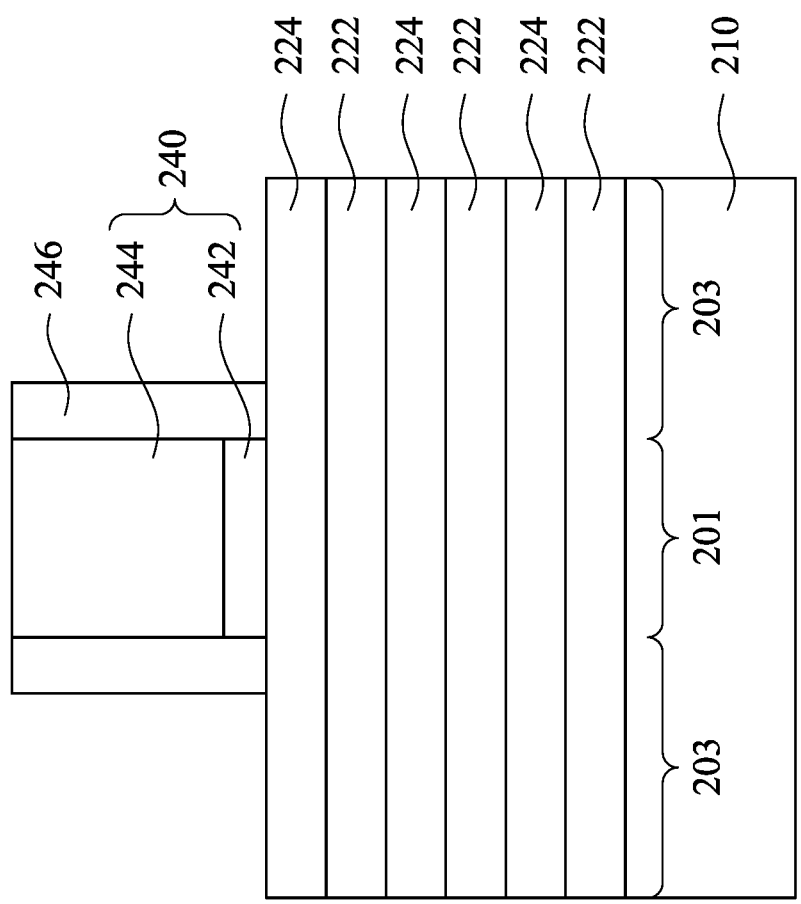

Please refer to FIG. 1, FIG. 3A and FIG. 3B, in which FIG. 3B is a cross-sectional view viewed along a cut line A-A' of FIG. 3A. At operation 104, the stack 220 is etched to form fins 220A and 220B. Each of the fins 220A and 220B has source and drain regions 203 and a channel region 201 between the source and drain regions 203. In some embodiments, the stack 220 may be patterned by alternately using different etchants to respectively etch the first layers 222 and the second layers 224. In some embodiments, the etchant for the first layers 222 may include a hydrocarbon gas and $H_2$. In some embodiments, the hydrocarbon gas includes an alkane, an alkene or an alkyne having 1 to 3 carbon atoms. For example, the etchant may be $CH_4/H_2$ or $C_2H_6/H_2$. In certain embodiments, the etchant for etching the first layer 222 does not include halogen or halides. In some embodiments, the second layers 224 may be etched by a halogen-based chemistry. In some embodiments, a portion of the substrate 210 is also removed to form trenches 212 into the substrate 210. The trenches 212 may be trench strips that are substantially parallel to each other. Similarly, the fins 220A and 220B are substantially parallel to each other.

Still referring to FIG. 3A and FIG. 3B, at operation 106, a material of trench isolations 230 may be deposited over the fins 220A and 220B and overfills the trenches 212. In some embodiments, the material of the trench isolations 230 may include silicon oxide, silicon nitride, silicon oxynitride, fluoride-doped silicate glass (FSG), or other low-K dielectric materials. In some embodiments, depositing the material of the trench isolations 230 may be performed by a high-density-plasma (HDP) chemical vapor deposition (CVD) process, using silane ($SiH_4$) and oxygen ($O_2$) as reacting precursors. In some other embodiments, depositing the material of the trench isolations 230 may be performed by a sub-atmospheric CVD (SACVD) process or high aspect-ratio process (HARP), in which process gases may comprise tetraethylorthosilicate (TEOS) and ozone ($O_3$). In yet other embodiments, depositing the material of the trench isolations 230 may be performed by a spin-on-dielectric (SOD) process, such as hydrogen silsesquioxane (HSQ) or methyl silsesquioxane (MSQ). Other processes and materials may be used. In some embodiments, the trench isolations 230 can have a multi-layer structure, for example, a thermal oxide liner layer with silicon nitride formed over the liner. Thereafter, a thermal annealing may be optionally performed to the trench isolations 230. A planarization process (e.g. chemical mechanical planarization (CMP)) and an etch process may then be performed to remove a portion of the material and form the trench isolations 230 in the trenches 212. The etch process may be performed by using diluted HF, SiCoNi (including HF and NH3), or the like as the etchant. The fins 220A and 220B protrude from the trench isolations 230.

Thereafter, a dummy gate structure 240 is formed across the fins 220A and 220B at operation 108, thereby forming a structure shown in FIG. 3A and FIG. 3B. The dummy gate structure 240 includes a dummy gate dielectric layer 242 and a dummy gate electrode layer 244 formed over the fins 220A and 220B. The dummy gate structure 240 will be removed later to process the fins 220A and 220B on the channel region 201, and a gate structure will then be formed over the channel region 201.

In some embodiments, the dummy gate dielectric layer 242 is blanket formed first over the fins 220A and 220B by chemical vapor deposition (CVD), physical vapor deposition (PVD), atomic layer deposition (ALD), plasma enhanced CVD (PECVD) or other suitable techniques. In some embodiments, the dummy gate dielectric layer 242 may be formed of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. Subsequently, the dummy gate electrode layer 244 is formed over the dummy gate dielectric layer 242. In some embodiments, the dummy gate electrode layer 244 is a conductive material and may be polycrystalline-silicon (poly-Si), poly-crystalline silicon-germanium (poly-SiGe), metallic nitrides, metallic silicides, metallic oxides, and metals. In some embodiments, the dummy gate electrode layer 244 includes a metal-containing material such as TiN, TaN, TaC, Co, Ru, Al, combinations thereof, or multi-layers thereof. In some embodiments, the dummy gate electrode layer 244 may be deposited by PVD, CVD, sputter deposition, or other techniques known and used in the art for depositing conductive materials. Other materials, conductive and non-conductive, may be used. The top surface of the dummy gate electrode layer 244 often has a non-planar top surface and may be planarized. The formation of the dummy gate structure 240 further includes a patterning operation. Then, the spacer layer 246 formed over sidewalls of the patterned dummy gate structure 240.

Figure 4A:
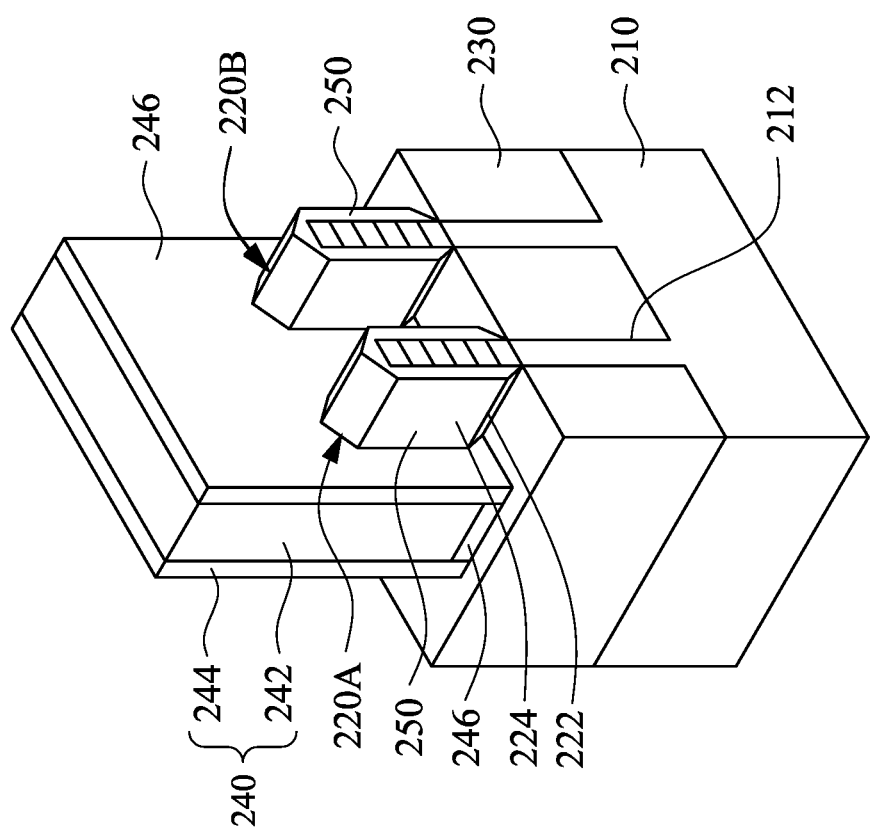
Figure 4B:
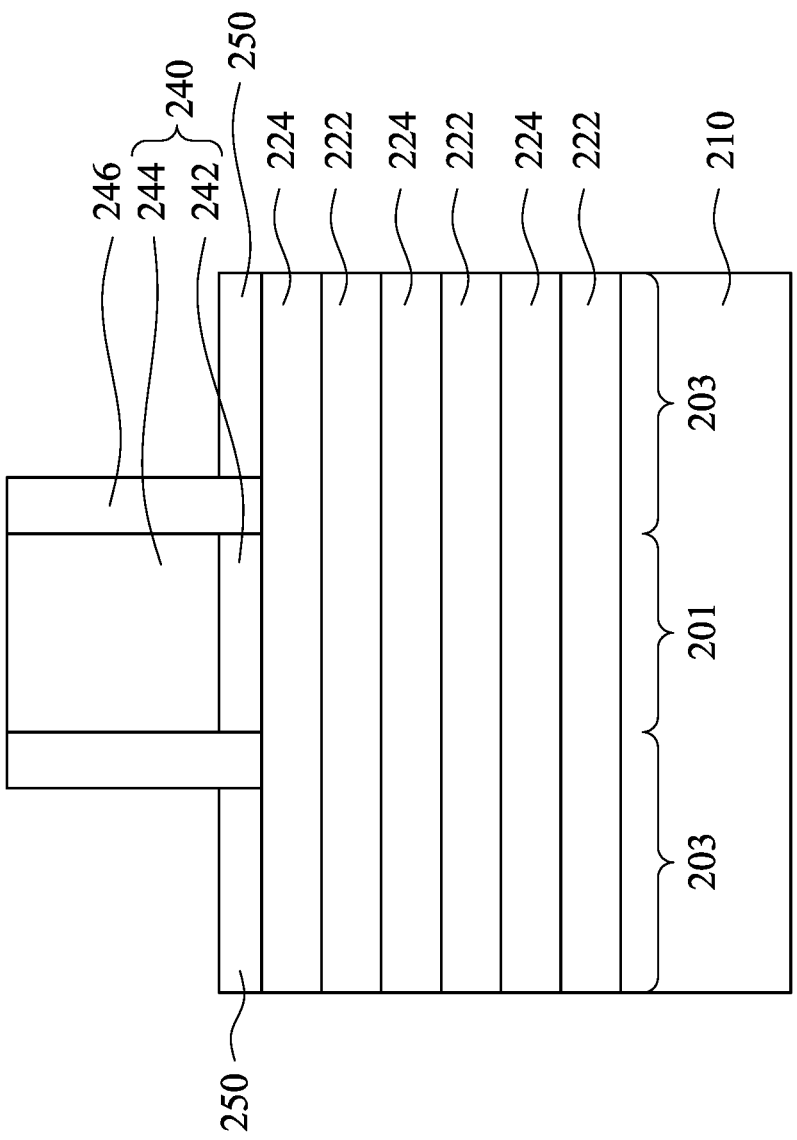

Reference is made to FIG. 1, FIG. 4A and FIG. 4B, in which FIG. 4B is a cross-sectional view viewed along a cut line A-A' of FIG. 4A. Next, source and drain structures 250 are epitaxially grown on the source and drain regions 203 of the fins 220A and 220B at operation 110 of FIG. 1. The source and drain structures 250 cover (e.g. peripherally enclose) sidewalls of the fins 220A and 220B in the source and drain regions 203. Epitaxial grown materials used for the source/drain structures 250 may be varied for the n-type and p-type FinFETs, such that one type of material is used for the n-type FinFETs to exert a tensile stress in the channel region 201 and another type of material for the p-type FinFETs to exert a compressive stress. In some embodiments, the epitaxial material may include doped or un-doped Si, SiGe, SiC or Ge, and dopants may be a n-type dopant or a p-type dopant. For example, SiC may be used to form n-type FinFETs, and SiGe or Ge may be used to form p-type FinFETs. Other materials may be used. In embodiments in which different materials are utilized for the n-type devices and the p-type devices, it may be desirable to mask one (e.g., the n-type fins) while forming the epitaxial material on the other (e.g., the p-type fins), and repeating the process for the other. The source/drain structures 250 may be doped either through an implanting process to implant appropriate dopants, or by in-situ doping as the material is grown.

Figure 5:
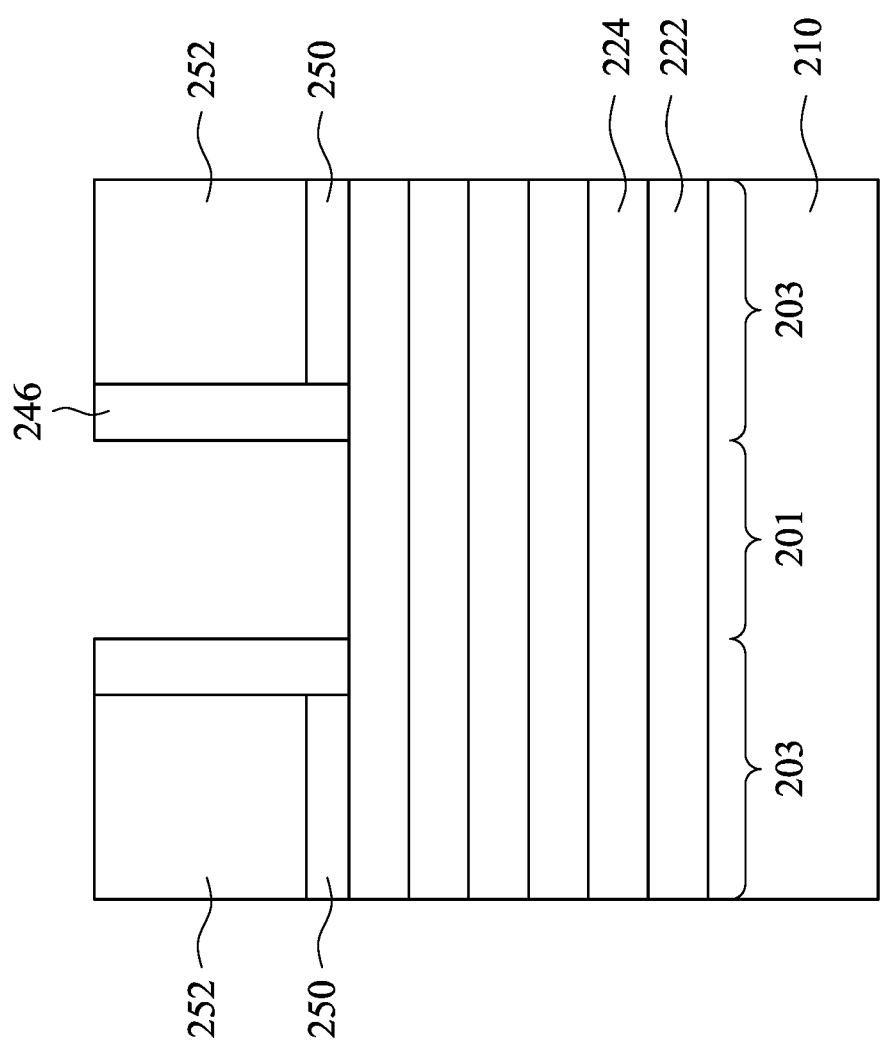

Reference is made to FIG. 1 and FIG. 5. A dielectric layer 252 is formed over the fins 220A and 220B at operation 112. The dielectric layer 252 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The dielectric layer 252 may be formed using, for example, CVD, ALD, spin-on-glass (SOG) or other suitable techniques. After the formation of the dielectric layer 252, a planarization process is performed to remove a portion of the dielectric layer 252 and expose a top surface of the dummy gate structure 240.

Still refer to FIG. 1 and FIG. 5. The dummy gate structure 240 is removed to expose the channel region 201 of the fins at operation 114. In some embodiments, the dummy gate structure 240 may be removed by multiple etching operations. For example, the dummy gate electrode layer 244 may be removed by a dry etching operation using $NF_3$, $SF_6$, $Cl_2$, HBr, the like, or a combination thereof or a wet etching operation using $NH_4OH$. And the dummy gate dielectric layer 242 may be removed by a wet etch operation using a diluted HF.

Figure 6:
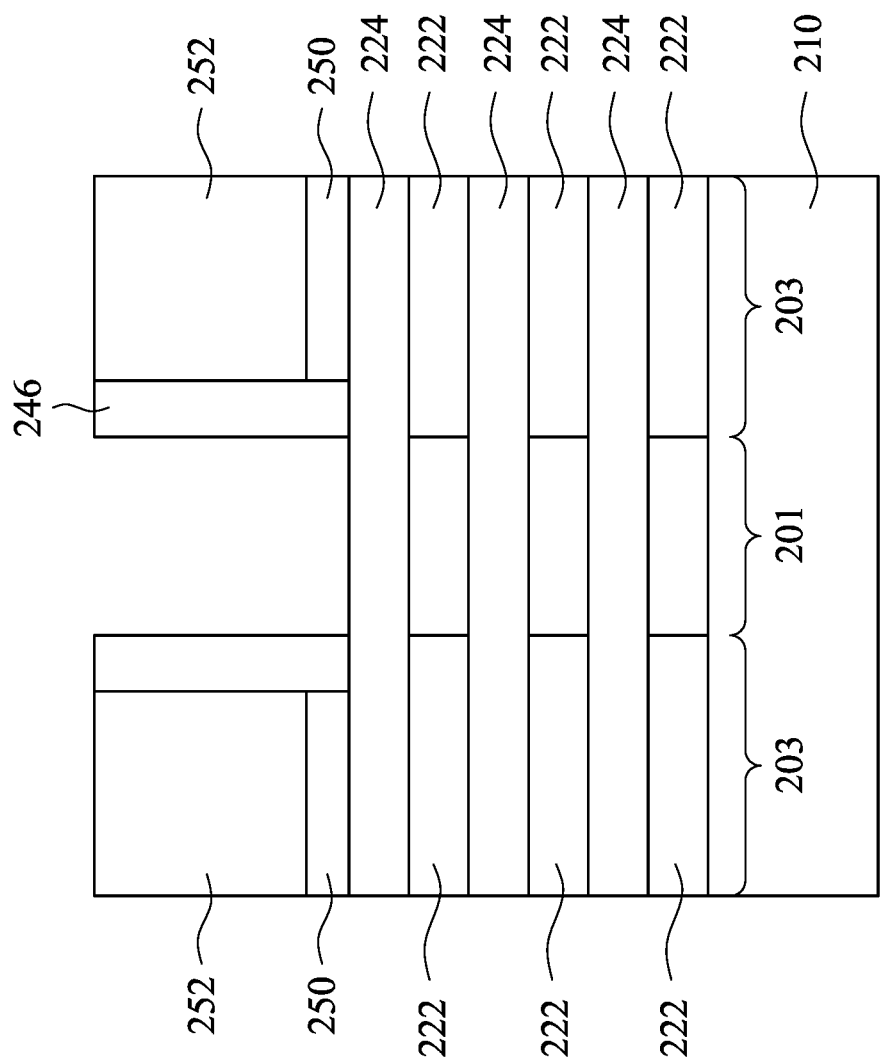

Reference is made to FIG. 1 and FIG. 6. A portion of each of the first layers 222 on the channel region 201 is removed, and the second layers 224 may be referred to plural nanowires at operation 116. The removal of the first layers 222 may be performed by an etching operation using a hydrocarbon gas and $H_2$ as an etchant. In some embodiments, the hydrocarbon gas includes an alkane, an alkene or an alkyne having 1 to 3 carbon atoms. For example, the etchant may be $CH_4/H_2$ or $C_2H_6/H_2$. In some embodiments, the etchant may be a mixture of $CH_4/H_2$ having a flow rate ratio in a range substantially from 8:12 to 12:8. In addition, argon may be further included in the etchant. The etching operation may be an anisotropic plasma etching performing under low pressure (e.g. about 1 mtorr to about 25 mtorr) and low direct current (dc) bias (about −100V to about −250V). It is beneficial that that the material of the first layers 222 can be etched by the hydrocarbon gas and $H_2$ having a higher selectivity of the first layers 222 with respect to the second layers 224. In other words, the etching operation using the hydrocarbon gas and $H_2$ as the etchant etches the first layers 222 at a higher etch rate than the etching operation using the hydrocarbon gas and $H_2$ as the etchant etches the second layers 224. Accordingly, the first layers 222 may be removed with less loss of the second layers 224, compared with the loss caused by the halogen-based chemistry for etching Si and SiGe. In some embodiments, a rounding operation may be optionally performed on the second layers 224 after the removal of the first layers 222 in the channel region 201. For example, a thermal oxidation operation at a temperature of about 300° C. to about 700° C. in an ambient of $O_2$ and a pressure about 0.5 torr to about 20 torr may be performed, followed by an oxidation layer removal operation. The oxidation layer removal operation may be performed using HF or annealing in an ambient $H_2$ at a temperature about 250° C. to about 600° C.

Figure 7:
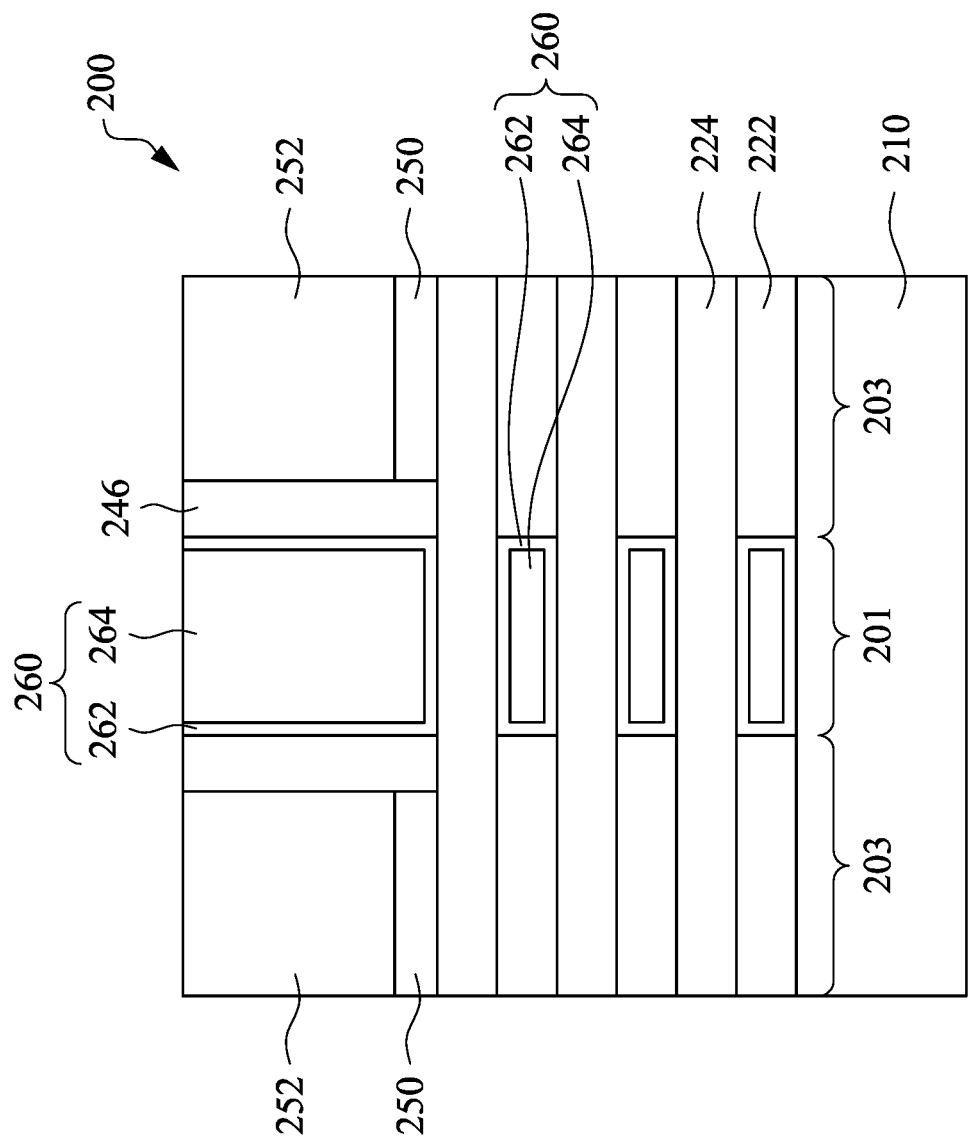

Reference is made to FIG. 1 and FIG. 7. A gate structure 260 is formed over the channel region 201 of the fins, and the gate structure 260 extends around the second layers 224, thereby forming semiconductor device 200, as shown in operation 118. The gate structure 260 includes a gate dielectric or ferroelectric layer 262 and a gate electrode 264. The gate dielectric or ferroelectric layer 262 is formed first and wraps (or crosses) around each of the second layers 224 on the channel region 201, and the gate electrode 264 is then formed on the gate dielectric or ferroelectric layer 262 and surrounds each of the second layers 224 on the channel region 201. In some embodiments, the gate dielectric or ferroelectric layer 262 includes one or more high-k dielectric layers (e.g., having a dielectric constant greater than 3.9). For example, the gate dielectric or ferroelectric layer 262 may include one or more layers of a metal oxide or a silicate of Hf, Al, Zr, combinations thereof, and multi-layers thereof, or anther suitable material including La, Mg, Ba, Ti, Pb or Zr in the form of metal oxide, metal alloyed oxide, and combinations thereof. The formation methods of gate dielectric or ferroelectric layer 262 include molecular-beam deposition (MBD), ALD, PVD, and the like. The gate electrode 464 may be formed from a metal including W, Cu, Ti, Ag, Al, TiAl, TiAlN, TaC, TaCN, TaSiN, Mn, or Zr. In an alternative embodiment, the gate electrode 264 includes a metal including TiN, WN, TaN, or Ru. The gate electrode 264 may be formed using a suitable process such as ALD, CVD, PVD, plating, or combinations thereof. A planarization operation, such as a CMP, may be performed to remove excess materials.

Figure 8A:
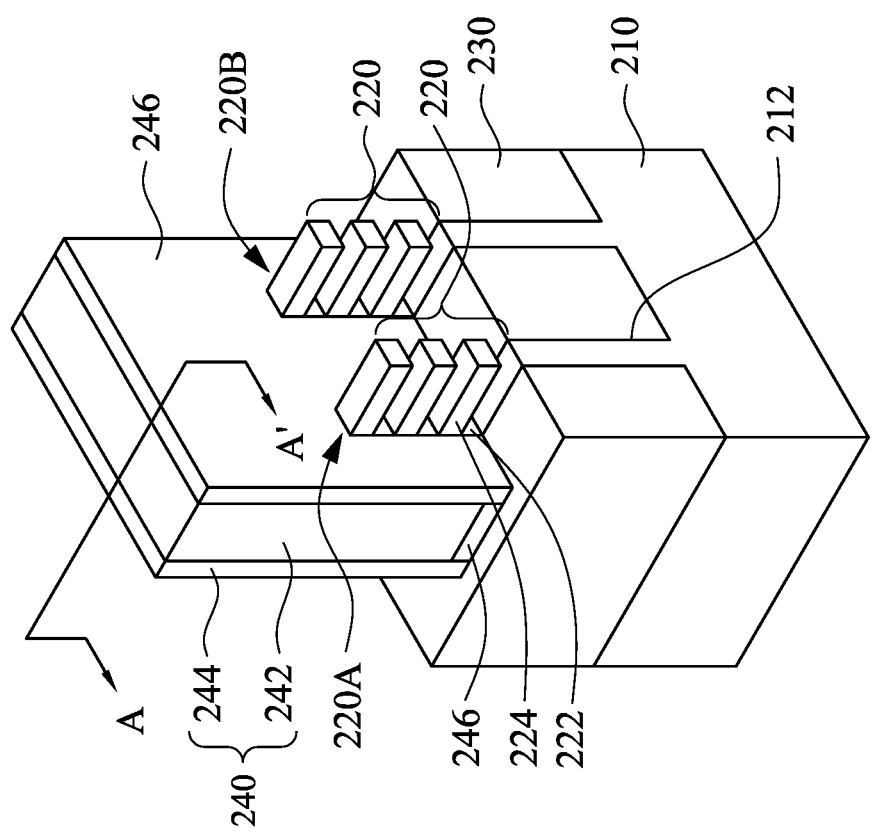
FIG. 8A through FIG. 10 provides various stages for forming a semiconductor device in accordance with some other embodiments of the present disclosure.
Figure 8B:
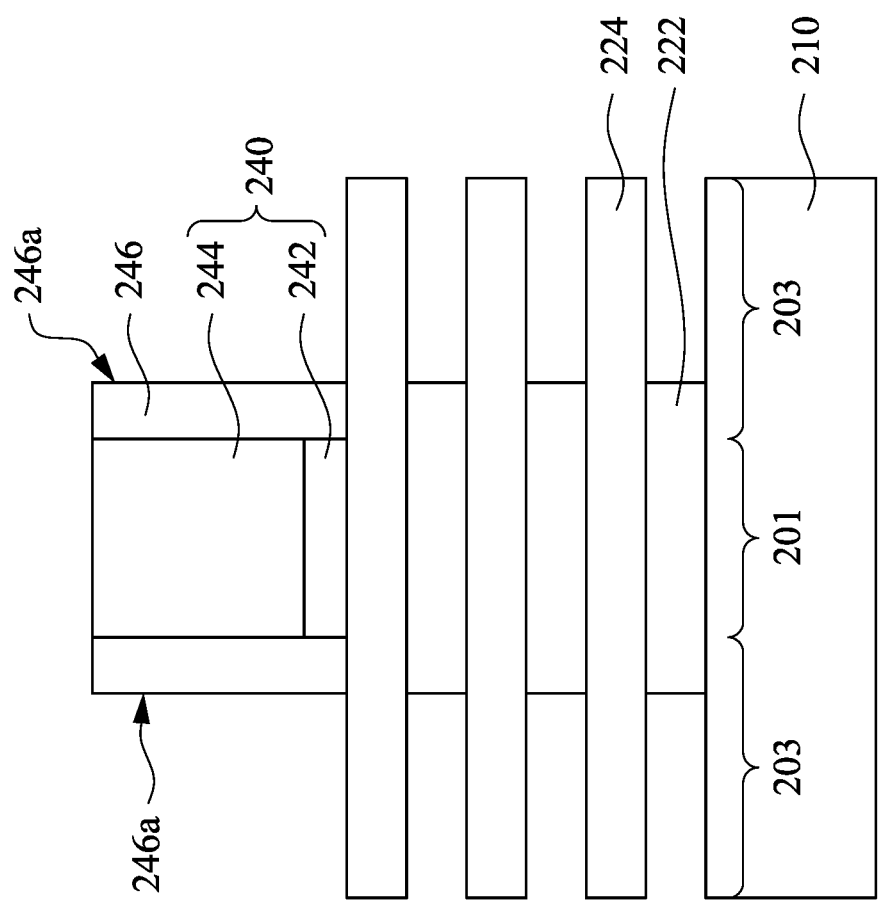

FIG. 8A through FIG. 10 provides various stages for forming a semiconductor device in accordance with some other embodiments of the present disclosure. The structure of FIG. 3A and FIG. 3B may be provided first. Reference is made to FIG. 8A and FIG. 8B, in which FIG. 8B is a cross-sectional view viewed along a cut line A-A' of FIG. 8A. Portions of each of the first layers 222 in the source and drain regions 203 of the fins 220A and 220B are removed. The portions of the first layers 222 in the source/drain regions 403 are removed until the remaining first layers 222 are vertically aligned with outer side 246a of the spacer layer 246, as shown in FIG. 8B. In some other embodiments, the second layers 224 on the source/drain regions 203 may be removed before/after the first layers 222 are removed. The removal of the first layer 222 is described in FIG. 6 and the operation 116, and may not be repeated herein. The second layer 224 may be removed by the halogen-based chemistry for etching Si and SiGe.

Figure 9A:
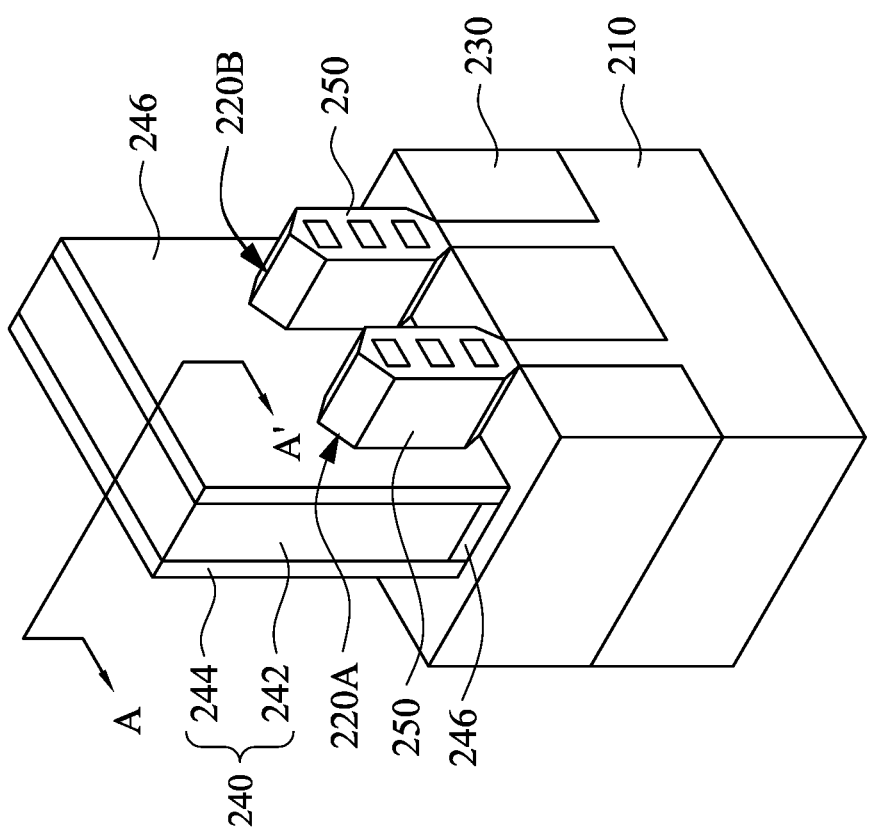
Figure 9B:
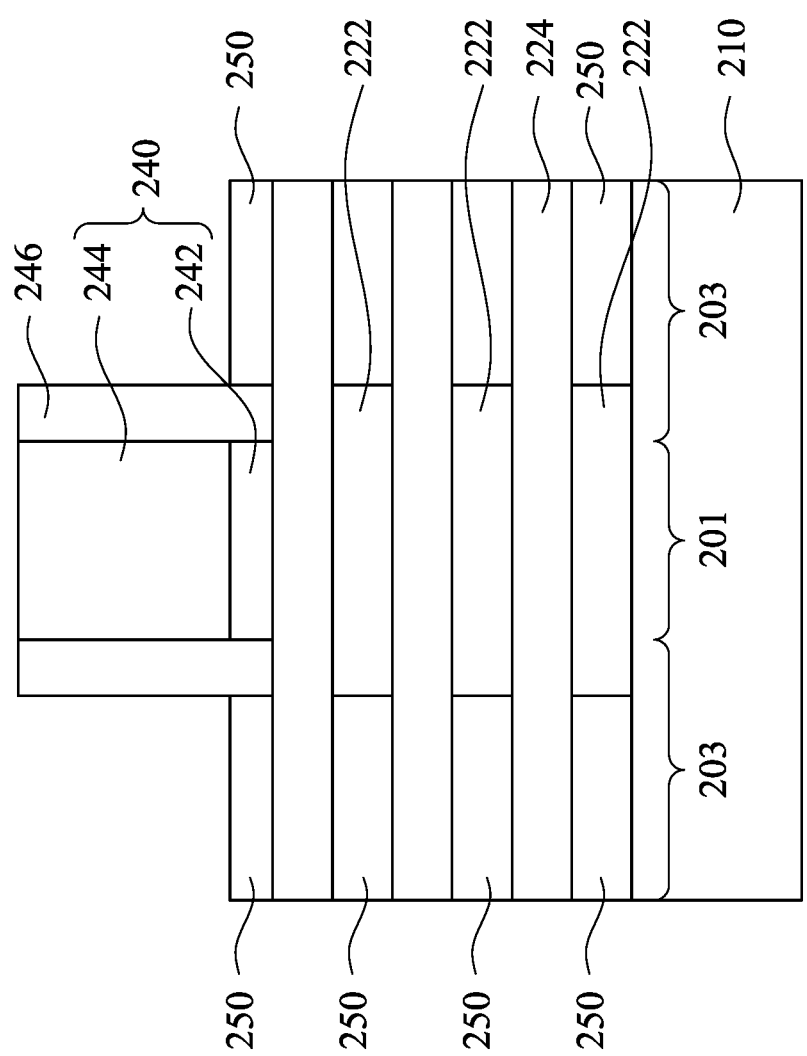
Figure 10:
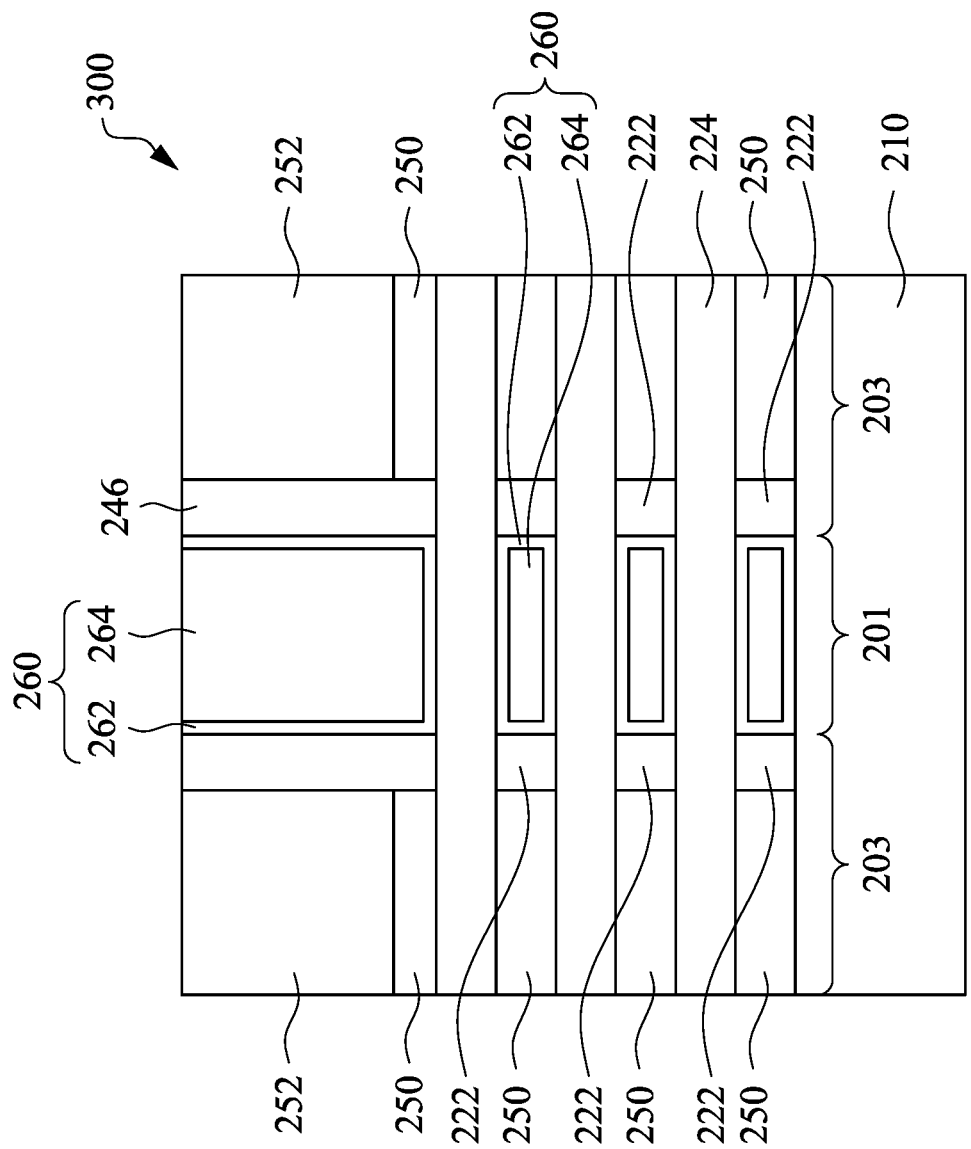

Reference is made to FIG. 9A and FIG. 9B, in which FIG. 9B is a cross-sectional view viewed along a cut line A-A' of FIG. 9A. The source and drain structures 250 are epitaxially grown respectively on the source and drain regions 203 of the fins 220A and 220B. In the embodiments of FIG. 9A and FIG. 9B, the source and drain structures 250 cover the sidewalls of the fins 220A and 220B, and further wrap (or extend around) the second layers 224 in the source/drain regions 203. The structure of FIG. 9A and FIG. 9B is subjected to the operations similar to FIG. 5 through FIG. 7, so as to form a semiconductor device 300 shown in FIG. 10. In FIG. 10, the remaining first layers 222 are disposed directly under the spacer layer 246, and may be referred to as inner spacers. The first layers 222 may be directly used as the inner spacers because the material of the first layers 222 has high band gap (e.g. about 3.75 eV for ZnS) to separate the source/drain structures 250 and the gate structure 260.

Figure 11:
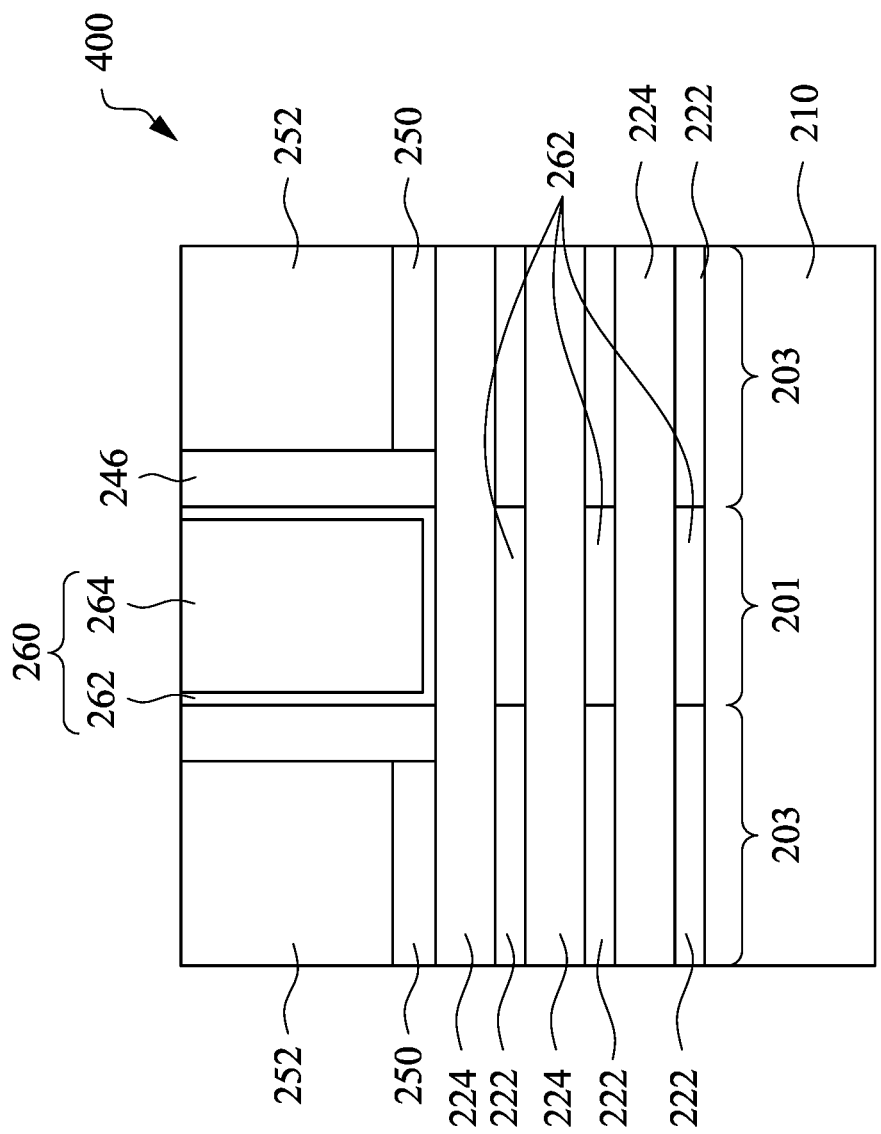
FIG. 11 is a cross-sectional view of a semiconductor device in accordance with some still other embodiments of the present disclosure.

Reference is made to FIG. 11. FIG. 11 is a cross-sectional view of a semiconductor device in accordance with some still other embodiments of the present disclosure. In some other embodiments, the stack in FIG. 11 is formed by the second layer 224 and the relatively thinner first layers 222, such that the distance between every two immediately adjacent second layers 224 is small, as shown in a semiconductor device 400. The space between every two immediately adjacent second layers 224 in the channel region 201 is filled with the gate dielectric or ferroelectric layer 262, and no gate electrode is allowed to be formed therein. FIG. 11 illustrates the embodiments without the inner spacer, while other semiconductor devices without the gate electrode between every two immediately adjacent second layers 224 may have the inner spacers in other embodiments.

Figure 12A:
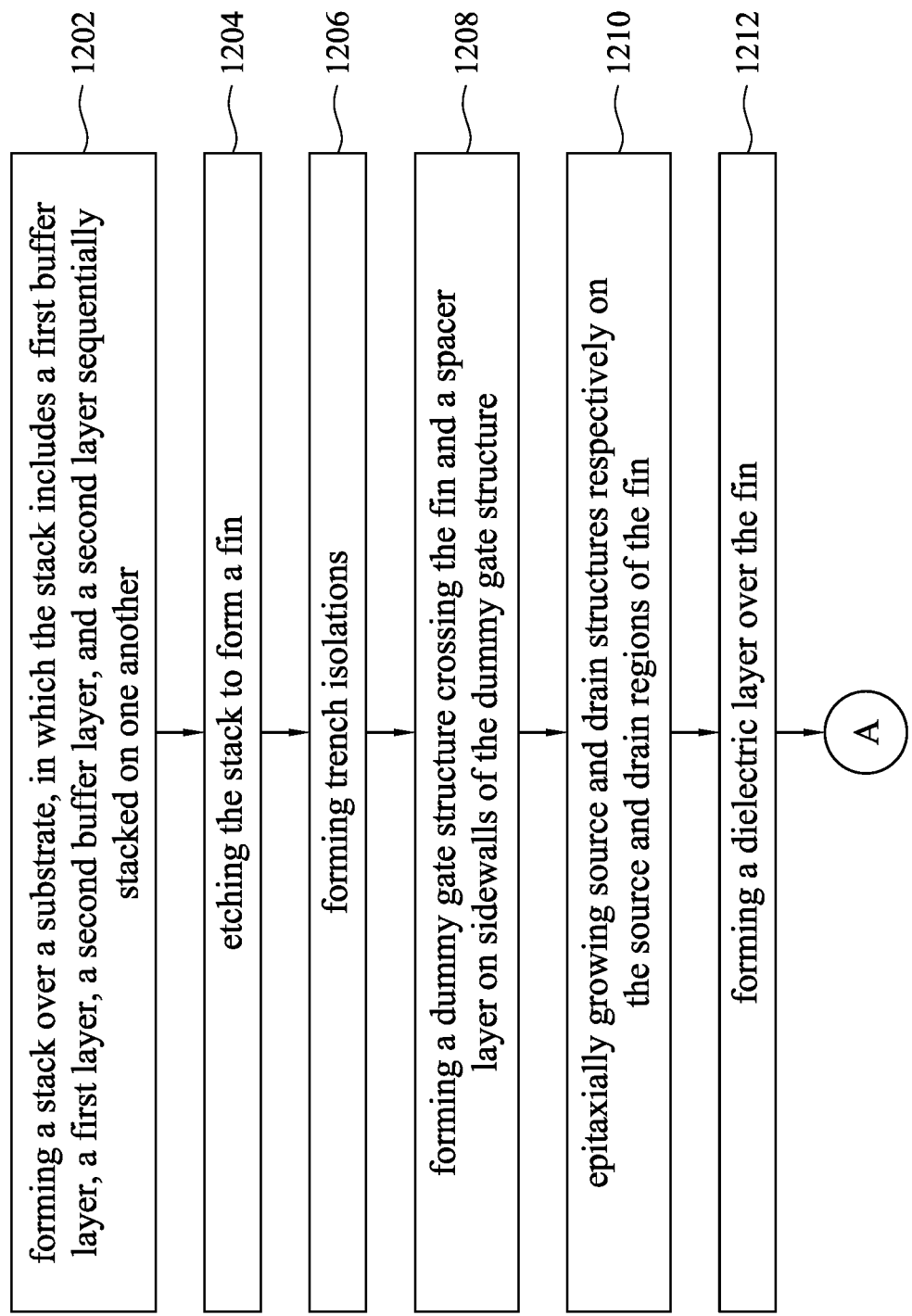
FIG. 12A and FIG. 12B are flow charts of a method for forming a semiconductor device in accordance with some embodiments of the present disclosure.
Figure 12B:
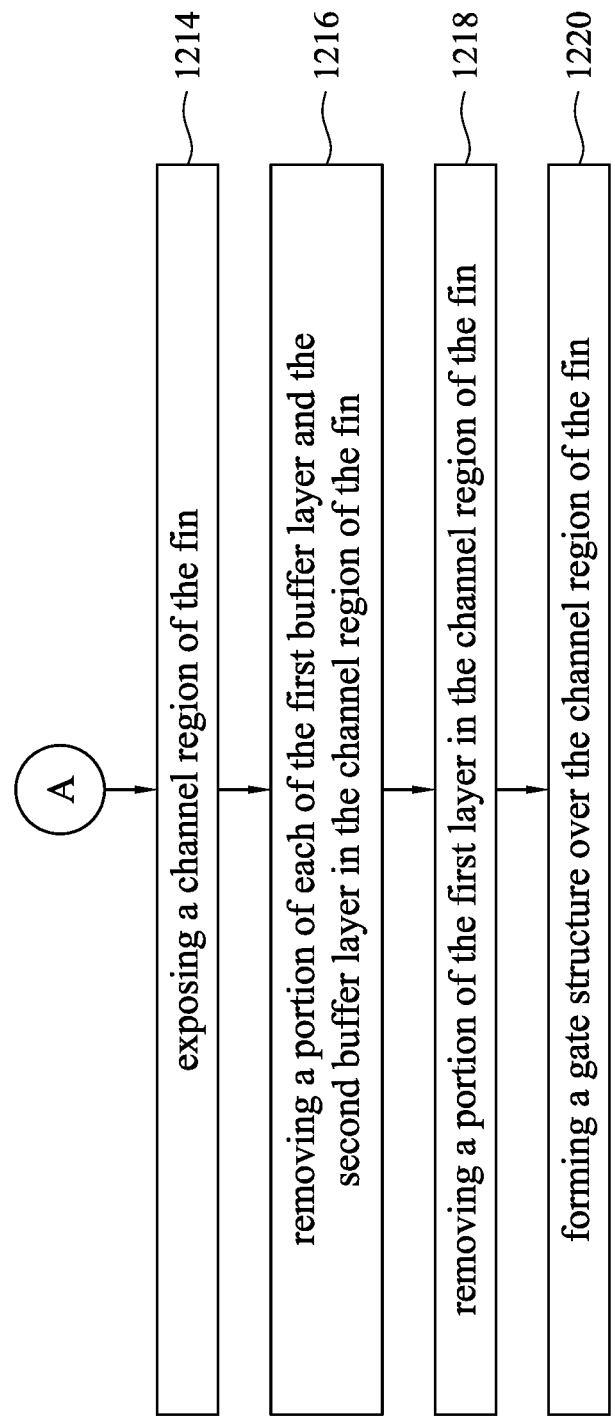
Figure 13:
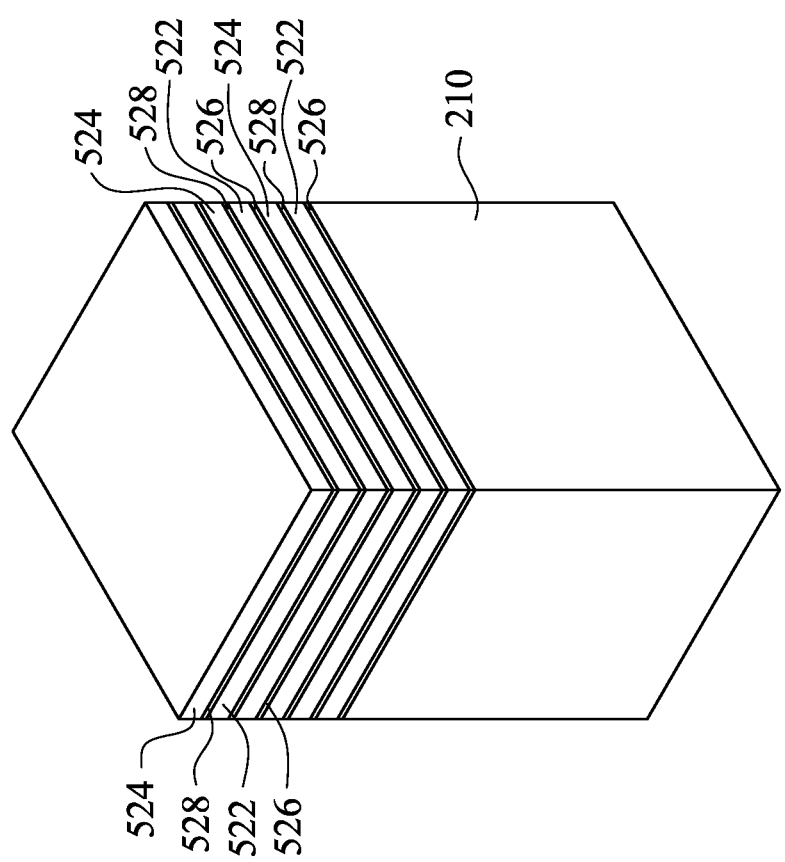
FIG. 13 through FIG. 19 show various stages of a method for forming a semiconductor device.

FIG. 12A and FIG. 12B are flow charts of a method for forming a semiconductor device in accordance with some embodiments of the present disclosure. FIG. 13 through FIG. 19 show various stages of a method for forming a semiconductor device. Reference is made to FIG. 12A and FIG. 13. A stack 520 is formed on the substrate 210 at operation 1202. The stack 520 includes a first buffer layer 526, a first layer 522, a second buffer layer 528 and a second layer 524 sequentially stacked on one another. The first layer 522 and the second layer 524 include Si, SiGe or Ge, and the first layer 522 is different from the second layer 524. For example, the first layer 522 includes SiGe, and the second layer 524 includes Si. Each of the first buffer layer 526 and the second buffer layer 528 include $ZnS_{1-x}Se_x$, $GaP_{1-x}As_x$, or combinations thereof and the x is greater than or equal to 0 and smaller than or equal to 1. In some embodiments, plural stacks 520 are formed.

In some embodiments, when a germanium content of the first layer 522 (e.g. SiGe) is greater than a germanium content of the second layer 524 (e.g. Si), the first buffer layer 526 has a gradually increasing Se or As content from a bottom of the first buffer layer 526 to a top of the first buffer layer 526, and each of the second buffer layer 528 has a gradually decreasing Se or As content from a bottom of the second buffer layer 528 to a top of the second buffer layer 528. In these embodiments, a lattice constant of the first layer 522 is greater than a lattice constant of the second layer 524, a lattice constant of the first buffer layer 526 gradually increases from a bottom of the first buffer layer 526 to a top of the first buffer layer 526, and a lattice constant of the second buffer layer 528 gradually decreases from a bottom of the second buffer layer 528 to a top of the second buffer layer 528. Therefore, the first buffer layer 526 and the second buffer layer 528 having the gradient content of Se or As match the lattice constants of the first layer 522 and the second layer 524, and the lattice mismatch and the strain in the transition layer in any two of Si, SiGe and Ge stack can be avoided.

In some embodiments, when a germanium content of the first layer 522 (e.g. SiGe) is greater than a germanium content of the second layer 524 (e.g. Si), the first buffer layer 526 has a gradually increasing Se or As content from a bottom of the first buffer layer 526 to a top of the first buffer layer 526, and the second buffer layer 528 has a gradually decreasing Se or As content from a bottom of the second buffer layer 528 to a top of the second buffer layer 528. In these embodiments, a lattice constant of the first layer 522 is greater than a lattice constant of the second layer 524, a lattice constant of the first buffer layer 526 gradually increases from a bottom of the first buffer layer 526 to a top of the first buffer layer 526, and a lattice constant of the second buffer layer 528 gradually decreases from a bottom of the second buffer layer 528 to a top of the second buffer layer 528. Therefore, the lattice constants of the first buffer layer 526 and the second buffer layer 528 having the gradient content of Se or As match the lattice constants of the first layer 522 and the second layer 524, and the lattice mismatch and the strain in the transition layer in any two of Si, SiGe and Ge stack can be avoided.

In some embodiments, the first buffer layer 526 and the second buffer layer 528 are respectively formed by $ZnS_{1-x}Se_x$ having a lattice constant A that can be calculated by the aforementioned formula (1). The first layer 522 and the second layer 524 may be formed from $Si_{1-a}Ge_a$ having a lattice constant B obtained from the aforementioned formula (2), in which a is greater than or equal to 0 and smaller than or equal to 1. For example, an upper limit and a lower limit of the Se content of the first buffer layer 526 and the second buffer layer 528 may be calculated. The upper limit matches with the lattice constant of the interface of the first layer 522 adjoining the first buffer layer 526 or the second buffer layer 528. The lower limit matches with the lattice constant of the interface of the second layer 524 adjoining the first buffer layer 526 or the second buffer layer 528. In some embodiments, the Se content of the first buffer layer 526 may linearly increase from a lower limit of about 0 at. % to an upper limit of about 15 at. %, and the Se content of the second buffer layer 528 may linearly decrease from the upper limit of about 15 at. % to the lower limit of about 0 at. %. However, the Se content may exponentially or stepwise increase in other embodiments.

In some embodiments, each of the first layer 522 and the second layer 524 respectively has a thickness in a range substantially from about 2 nm to about 15 nm. In some embodiments, each of the first buffer layer 526 and the second buffer layer 528 has a thickness in a range substantially smaller than about 5 nm and greater than 0. If the first buffer layer 526 and the second buffer layer 528 are thicker than 5 nm, a number of the first layer 522 and the second layer 524 in the stack 520 may decrease because of the limitation of a height (or a thickness) of the stack 520. In some embodiments, the stack 520 may have a thickness in a range substantially smaller than or equal to about 100 nm and greater than about 4 nm. With the first buffer layer 526 and the second buffer layer 528, the strain and lattice mismatch may be prevented, such that the thickness of the stack 520, and/or the number of pairs of the first layer 522/the second layer 524 in the stack 520 may increase to provide sufficient process flexibility.

Figure 14A:
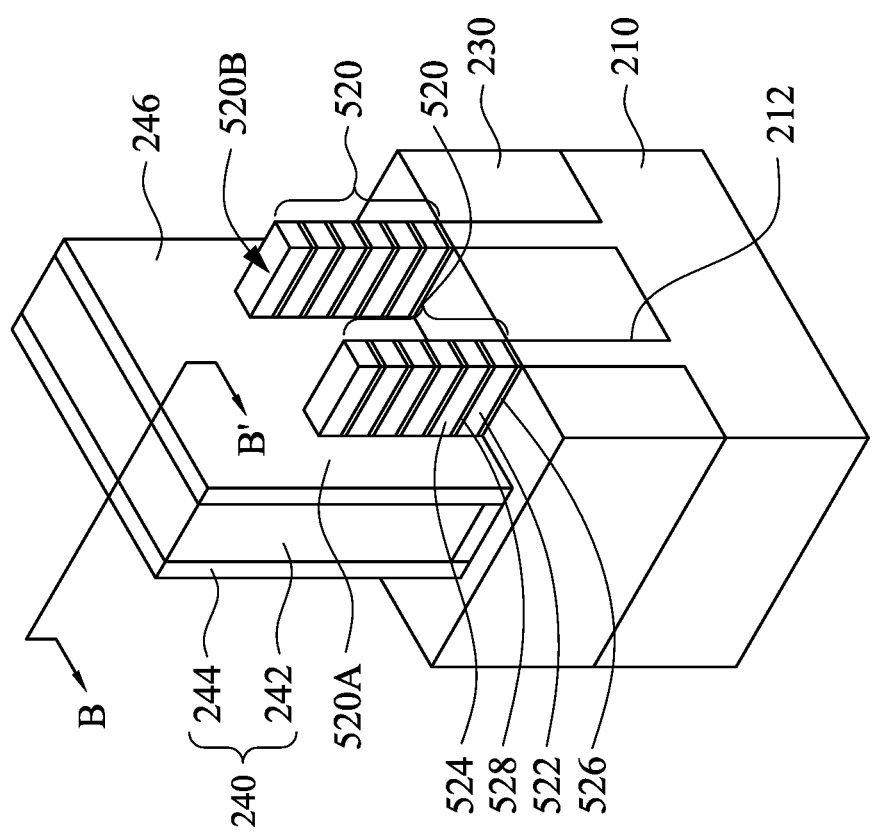
Figure 14B:
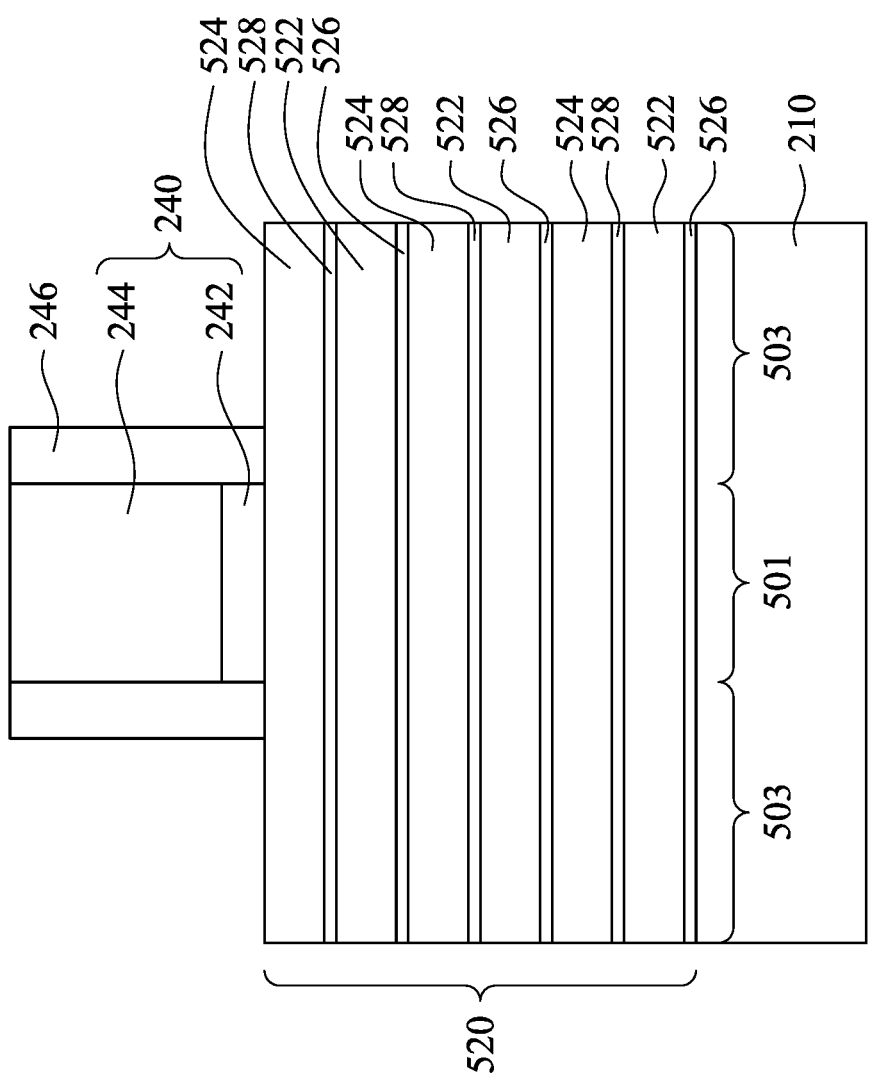
Figure 15A:
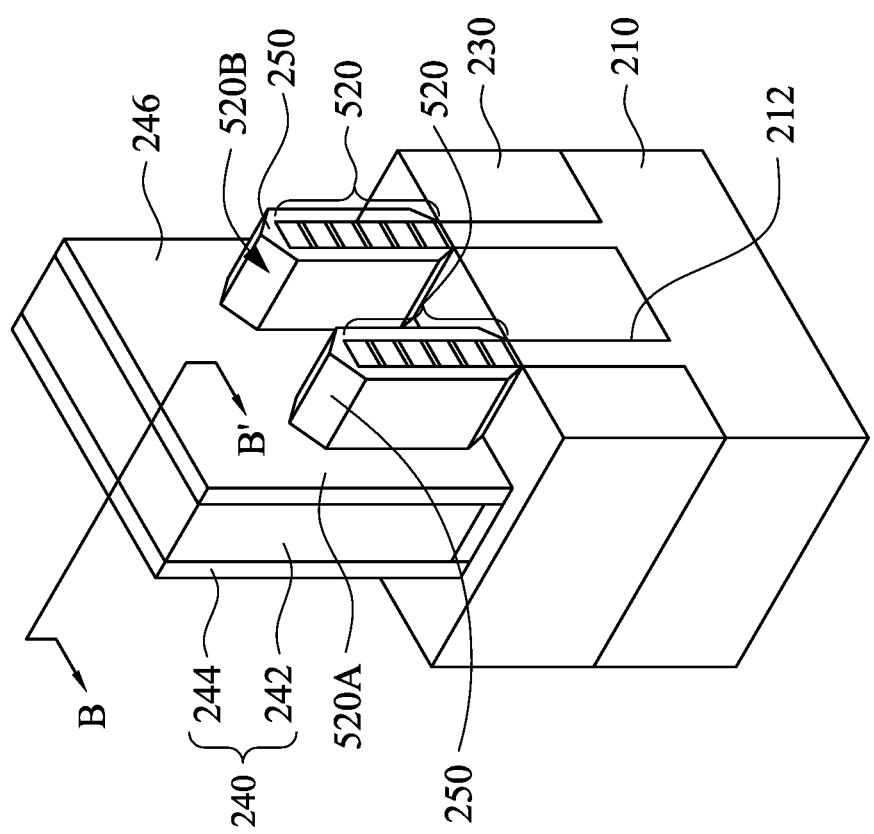
Figure 15B:
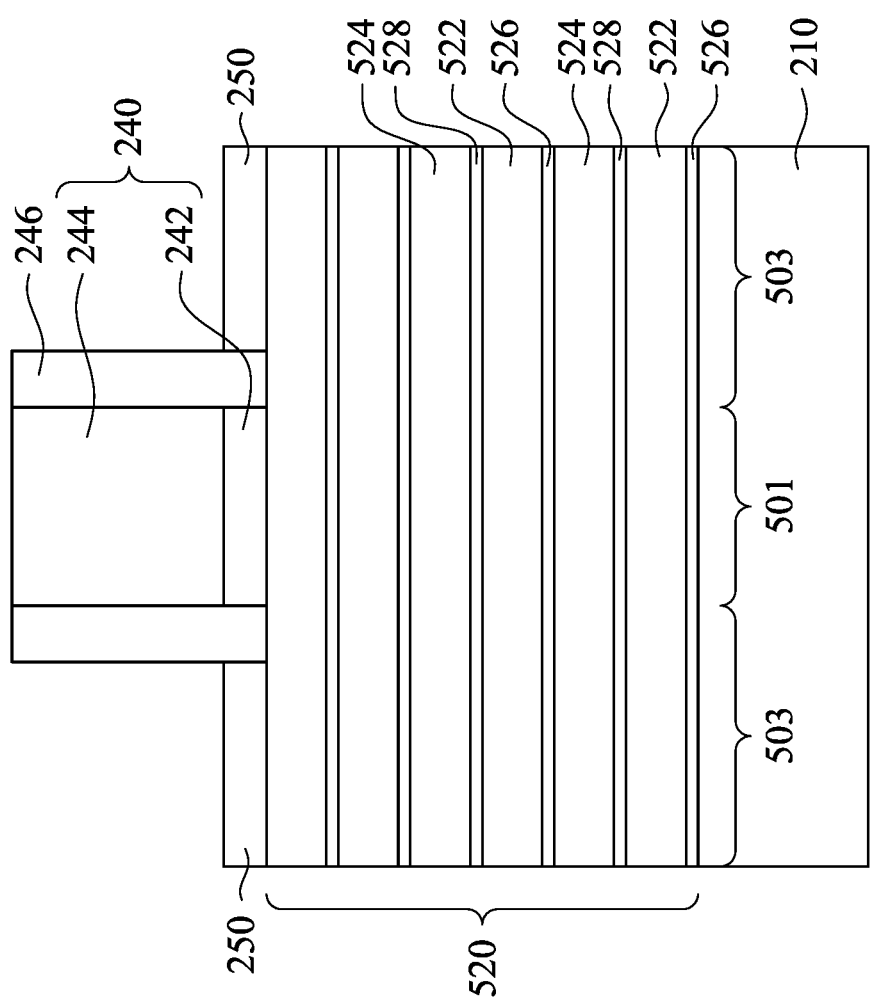

For convenience of explanation, the first layer 522 formed from SiGe and the second layer 524 formed from Si are used as an example. However, other embodiments may include different arrangement of the first buffer layer 526, the first layer 522, the second buffer layer 528 and the second layer 524. Reference is made to FIG. 12A, FIG. 14A and FIG. 14B, in which FIG. 14B is a cross-sectional view viewed along a cut line B-B' of FIG. 14A. After the stack 520 is formed, the stack 520 and a portion of the substrate 210 may be patterned to form two fins 520A and 520B at operation 1204. The fins 520A and 520B have source and drain regions 503 and a channel region 501 between the source and drain regions 503. Then, at operation 1206 and operation 1208, the trench isolations 230, the dummy gate structure 240 and the spacer layer 246 are formed as described in FIG. 3A and FIG. 3B. Reference is made to Fig.12A, FIG. 15A and FIG. 15B. At operation 1210, the source and drain structures 250 are epitaxially grown on the source and drain regions 503 of the fins 520A and 520B. The operation for epitaxially growing the source and drain structures 250 may be performed by the operation described above with respect to FIG. 4A and FIG. 4B.

Figure 16:
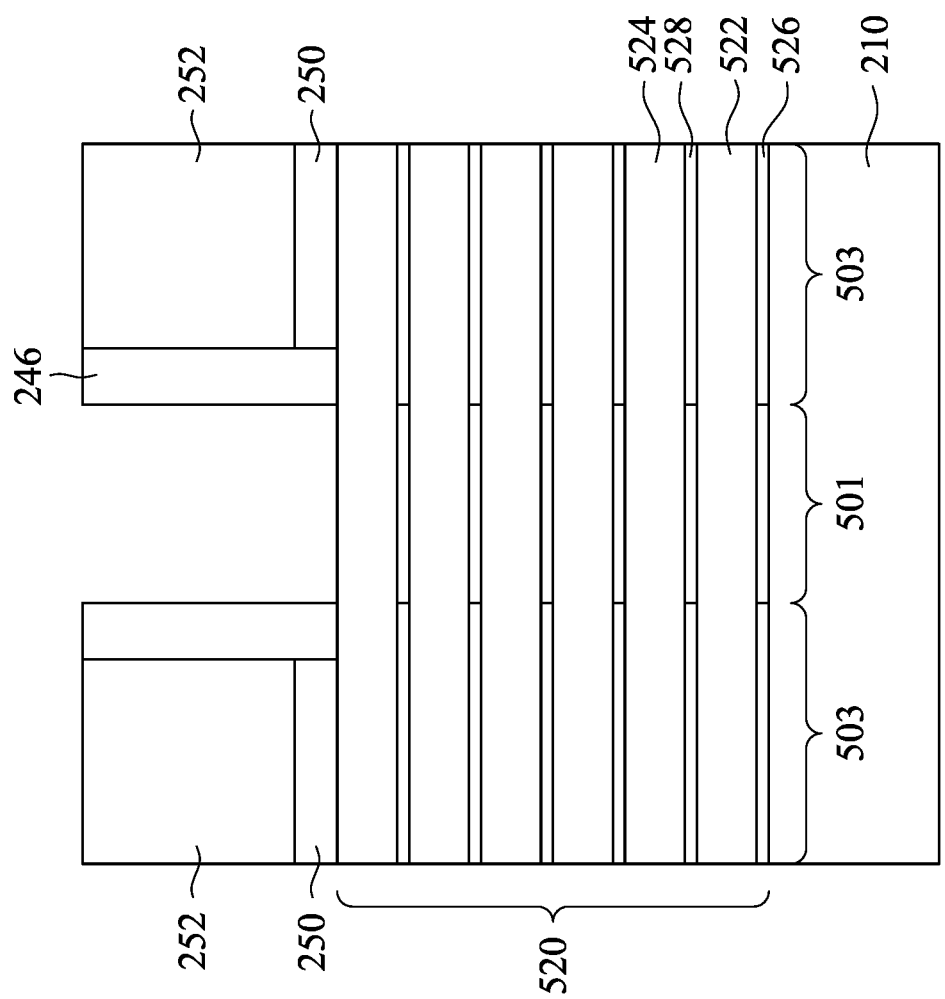

Reference is made to FIG. 12A, FIG. 12B and FIG. 16. Then, a dielectric layer 252 is formed on the stack 520, and a top surface of the dummy gate structure 240 is exposed at operation 1212. The dummy gate structure 240 is then removed to expose the fins on the channel region 501 at operation 1214. The operations 1212 and 1214 are respectively similar to the operations 112 and 114 described above with respect to FIG. 5, and may not be repeated herein. The first buffer layer 526 and the second buffer layer 528 on the exposed channel region 501 are subsequently removed at operation 1216. In some embodiments, a mask layer (not shown) may be formed on the dummy gate structure 240 on one fin (e.g. the fin 520B of FIG. 14A) to process the channel region 501 of the other fin (e.g. the fin 520A of FIG. 14A) first. For example, the mask layer may be formed from silicon nitride. In some embodiments, the first buffer layer 526 and the second buffer layer 528 may be removed by an etching operation using a hydrocarbon gas and $H_2$ as an etchant. In some embodiments, the hydrocarbon gas includes an alkane, an alkene or an alkyne having 1 to 3 carbon atoms. For example, the etchant may be $CH_4/H_2$ or $C_2H_6/H_2$. In some other embodiments, the etchant may be a mixture of $CH_4/H_2$ having a flow rate ratio in a range substantially from 8:12 to 12:8. In addition, argon may be further included in the etchant. The etching operation may be an anisotropic plasma etching performing under low pressure (e.g. about 1 to about 25 mtorr) and low direct current (dc) bias (about −100V to about −250V). The removal of the first buffer layer 526 and the second buffer layer 528 is advantageous to the subsequent formation of nanowires because a space is formed between the first layer 522 and second layer 524. The space prevents the migration of Ge atoms between the SiGe layer (i.e. the first layer 522) and the silicon layer (i.e. the second layer 524), and thus the transition layer may be reduced or may not be existed. Accordingly, the selectivity of an etching operation for removing the first layer 522 with respect to the second layer 524 increases (i.e. the etching operation etches the first layers 522 at a higher etch rate than the etching operation etches the second layers 524), such that the loss of the nanowires (each of which is formed by the second layer 524) can be reduced.

Figure 17:
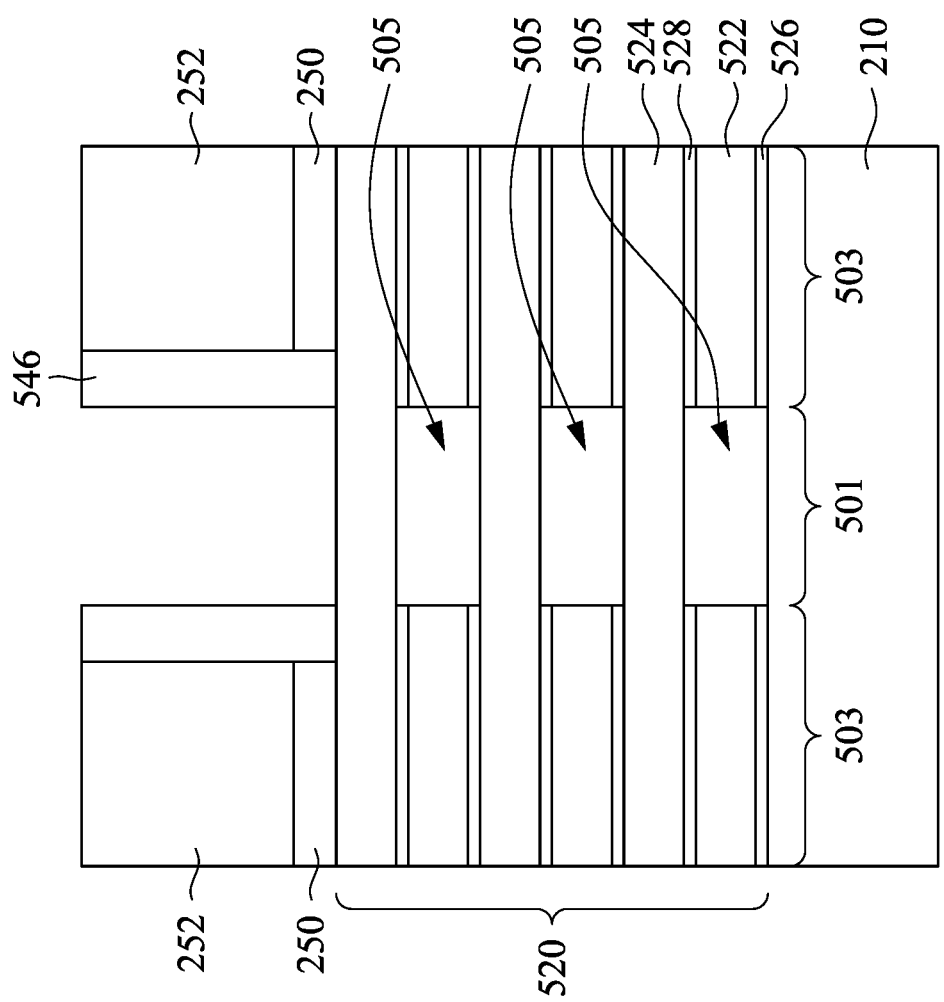

Reference is made to FIG. 12B and FIG. 17. The first layer 522 in the exposed channel region 501 may be removed, and the second layer 524 remains to form nanowires at operation 1218. As shown in FIG. 17, after the first layer 522 is removed, a hole 505 may be formed, in which a gate structure may be formed in the hole 505. In some embodiments, the first layer (SiGe) 522 may be removed by either $SF_6$ or $CF_4$ or HBr or their mixtures with $H_2$ or the like.

After the nanowires are formed in the fin (e.g. the fin 520A in FIG. 14A), the nanowires in the other fin (e.g. the fin 520B in FIG. 14A) may then be formed using similar operations described in FIG. 16 through FIG. 17. However, each of the nanowires of the first layer 522 of the other fin (e.g. the fin 520B of FIG. 14A) may be formed using a different etchant to remove the second layer 524 in the stack 520. The etchant may be, for example, a hydrogen-based etchant or a halogen-based (e.g. F, Cl and Br) etchant.

Figure 18:
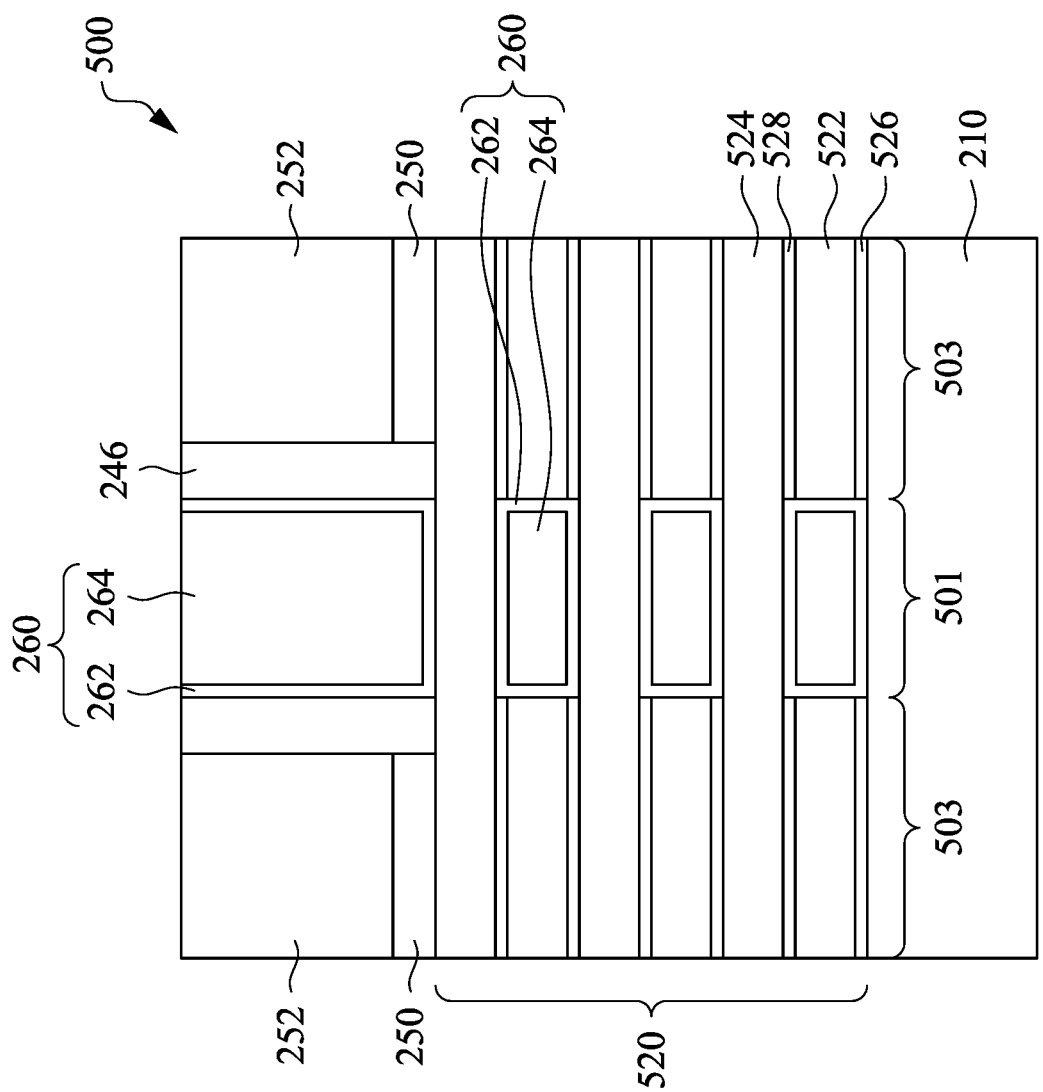
Figure 19:
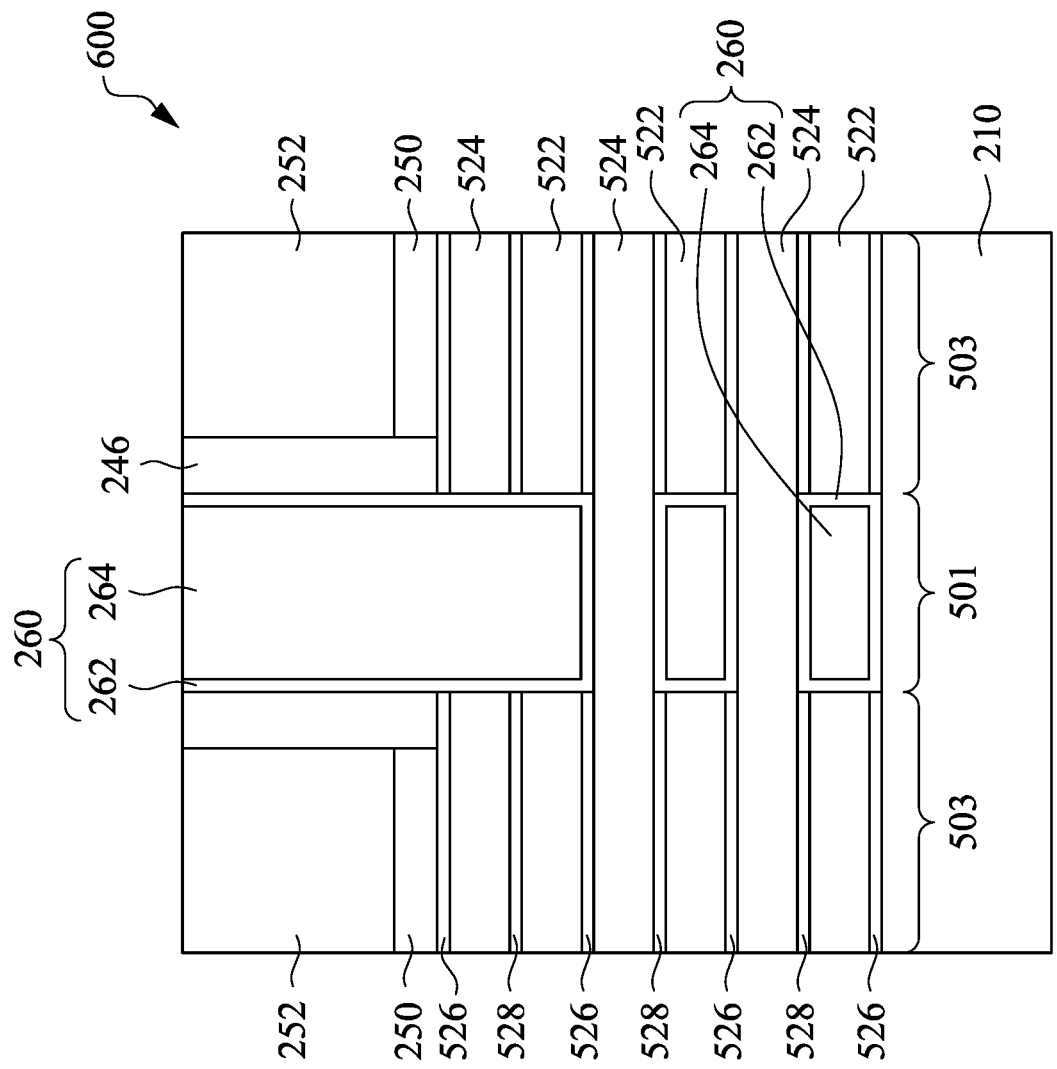

Reference is made to FIG. 12B, FIG. 18 and FIG. 19. After the nanowires in both fins are formed, the gate structure 260 including the gate dielectric or ferroelectric layer 262 and the gate electrode layer 264 may be respectively formed in each of the fins at operation 1220. The operation for forming gate structure 260 is similar to the operation 118 described above with respect to FIG. 7. And, semiconductor devices 500 and 600 may be respectively formed. The semiconductor device 500 has the second layer 524 (Si) remaining as the nanowires, and the semiconductor 600 has the first layer 522 (SiGe) remaining as the nanowires. In some embodiments, the semiconductor devices 500 and 600 having different type of nanowires may be used to form a CMOS device, in which the nanowires includes silicon may be used in a N-type device and the nanowires includes SiGe may be used in a P-type device.

Figure 20:
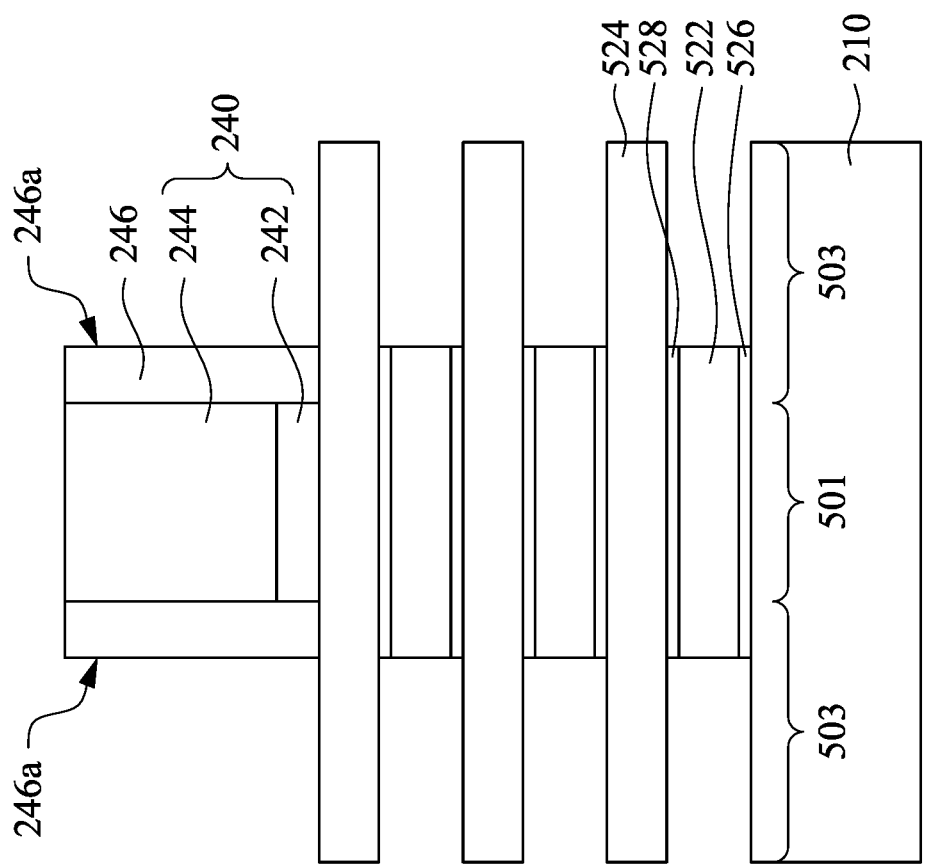
FIG. 20 through FIG. 22 show cross-sectional views of various stages of a method of forming a semiconductor device in accordance with some other embodiments of the present disclosure.
Figure 21:
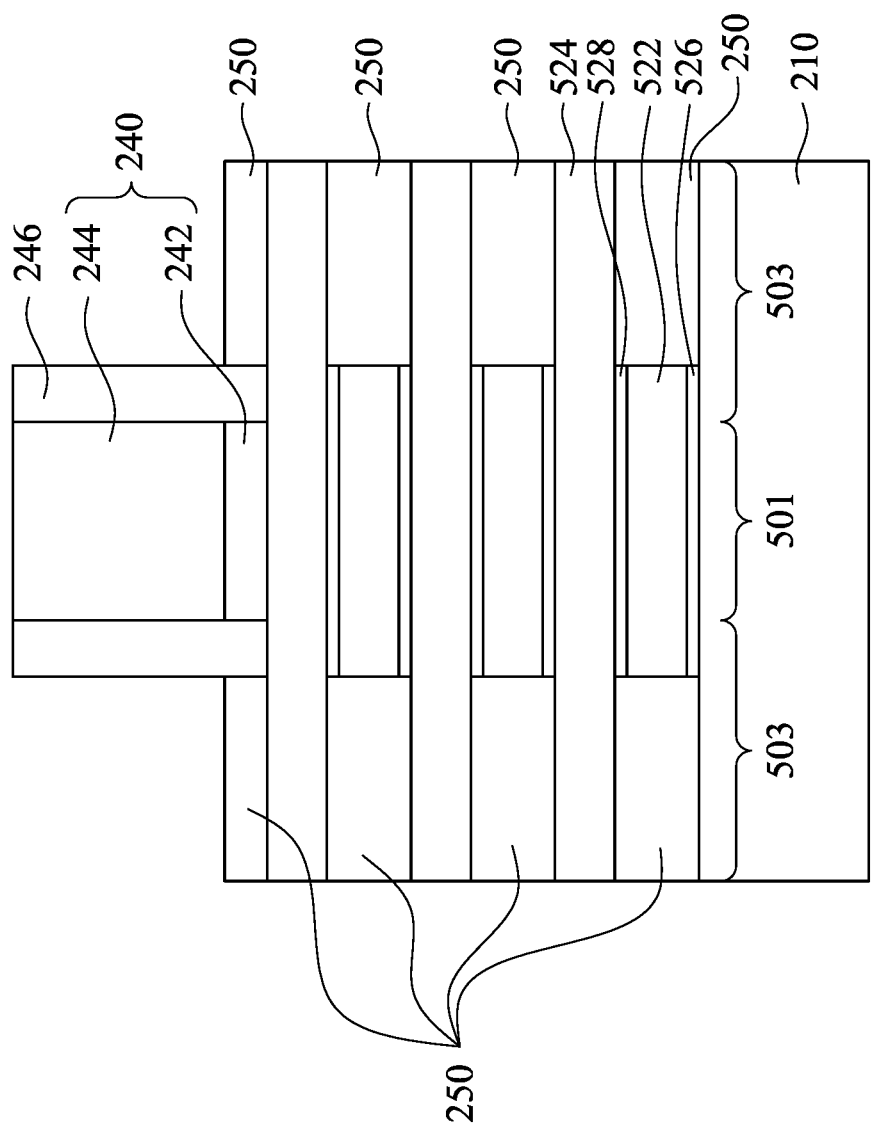
Figure 22:
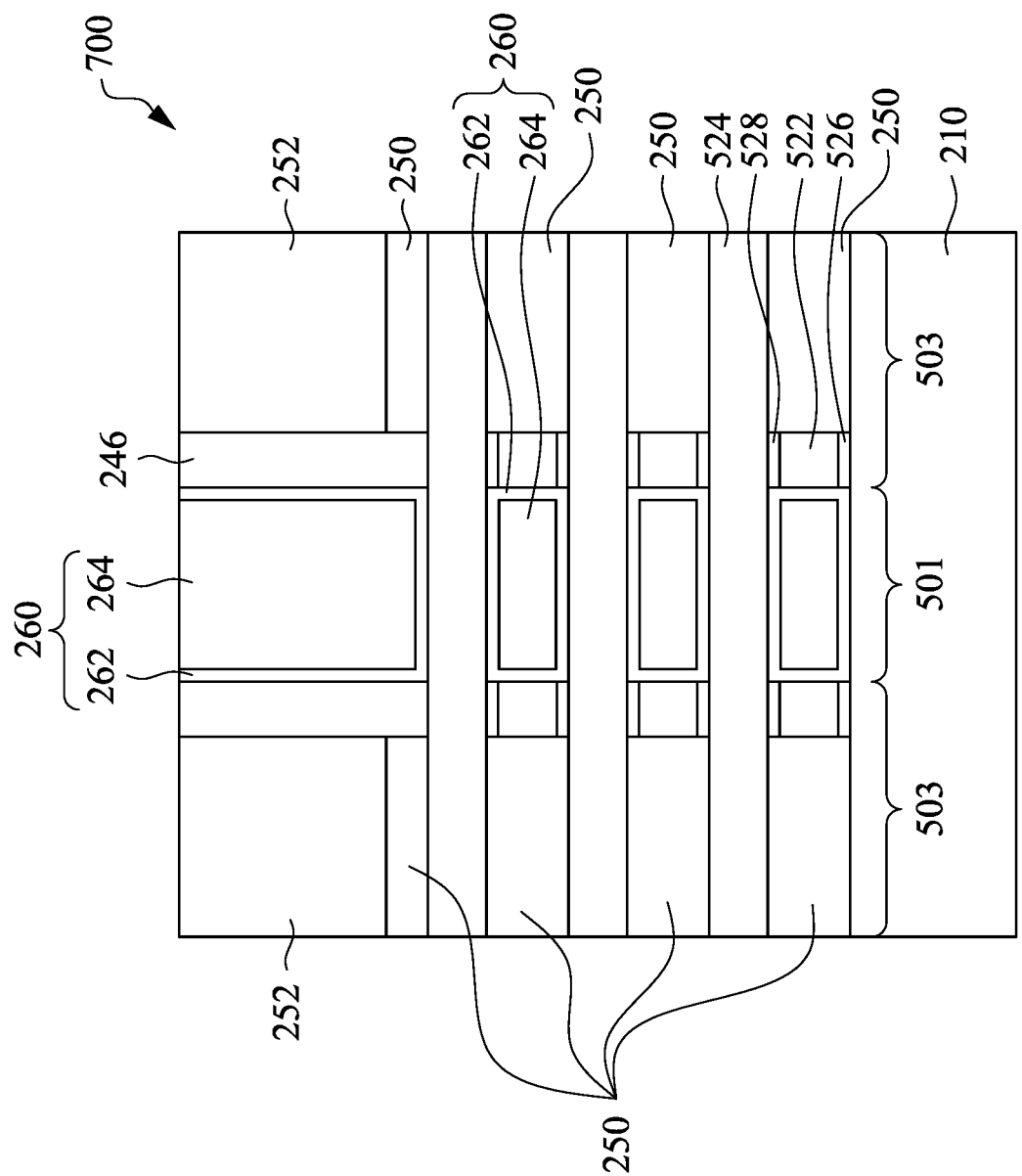

FIG. 20 through FIG. 22 show cross-sectional views of various stages of a method of forming a semiconductor device in accordance with some other embodiments of the present disclosure. Reference is made to FIG. 20. The structure of FIG. 14A and FIG. 14B is provided. Similarly to the operation described with respect to FIG. 8A and FIG. 8B, portions of the first layer 522, the first buffer layer 526 and the second buffer layer 528 in the source/drain regions 503 may be removed, for example, until they are vertically aligned with the outer sides 246a of the spacer layer 246. Details of the removal of the first layer 522, the first buffer layer 526 and the second buffer layer 528 in the source and drain regions 503 may be same as that in the channel region 501, and may not be repeated herein. In some embodiments, the first buffer layer 526 and the second buffer layer 528 are removed first, followed by the removal of the first layer 522. In some other embodiments, the first layer 522 is removed first, followed by the removal of the first buffer layer 526 and the second buffer layer 528. The first layer 522 is separated from the second layer 524 and the loss due to the interaction near the boundary of Si and SiGe surfaces may be reduced during the removal of the first layer 522.

Reference is made to FIG. 21. The source and drain structures 250 are formed. In the embodiments of FIG. 21, the source and drain structures 250 wrap (or extend around) the second layer 524 in the source and drain regions 503. The structure of FIG. 21 is then subjected to the operations same as FIG. 16 through FIG. 18, and a semiconductor device 700 is then formed, as shown in FIG. 22. In the semiconductor device 700, the remaining portions of the first layer 522, the first buffer layer 526 and the second buffer layer 528 are directly disposed under the spacer layer 246.

Figure 23:
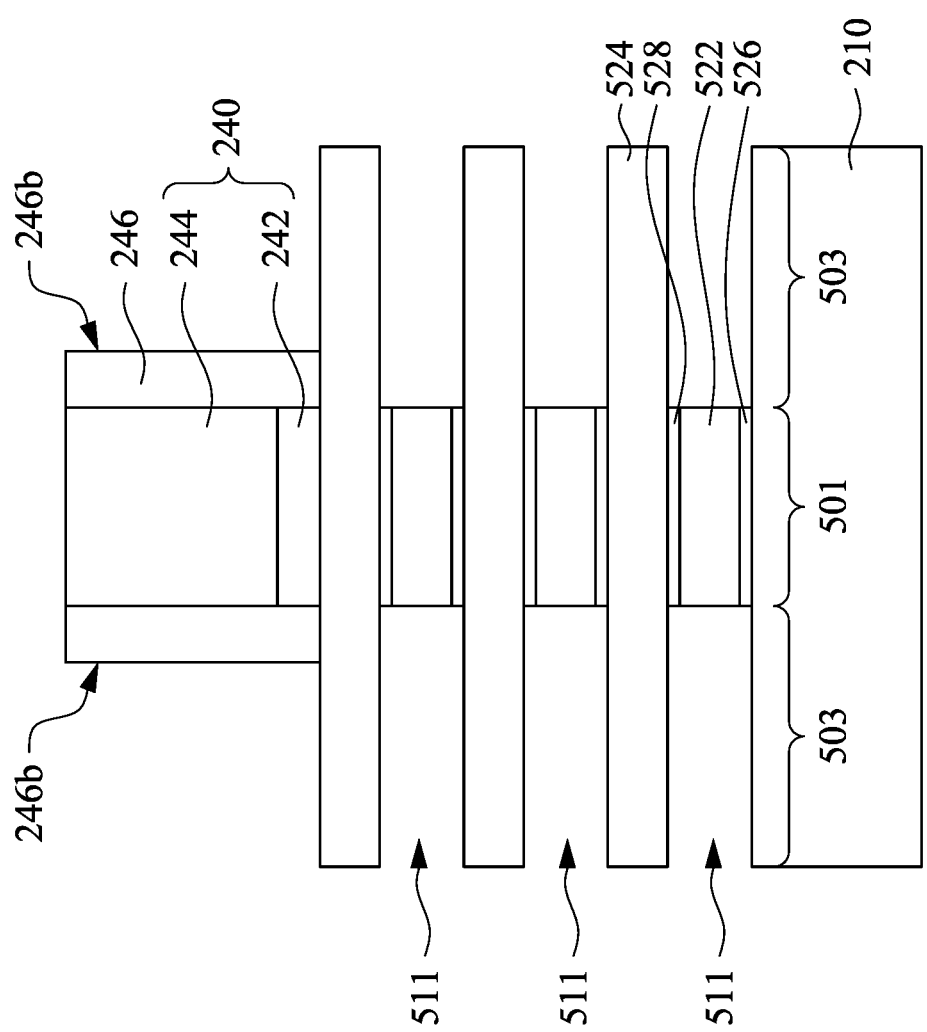
FIG. 23 through FIG. 26 show cross sectional views of various stages of forming a semiconductor device in accordance with some still other embodiments of the present disclosure.

FIG. 23 through FIG. 26 show cross sectional views of various stages of forming a semiconductor device in accordance with some still other embodiments of the present disclosure. Reference is made to FIG. 23. The structure of FIG. 14A and FIG. 14B is provided. Similarly to the operation of FIG. 20, the first layer 522, the first buffer layer 526 and the second buffer layer 528 in the source and drain regions 503 are removed. However, in the embodiments of FIG. 23, the first layer 522, the first buffer layer 526 and the second buffer layer 528 in the source and drain regions 503 are removed until they are vertically aligned with inner sides 246b of the spacer layer 246, thereby forming recesses 511.

Figure 24:
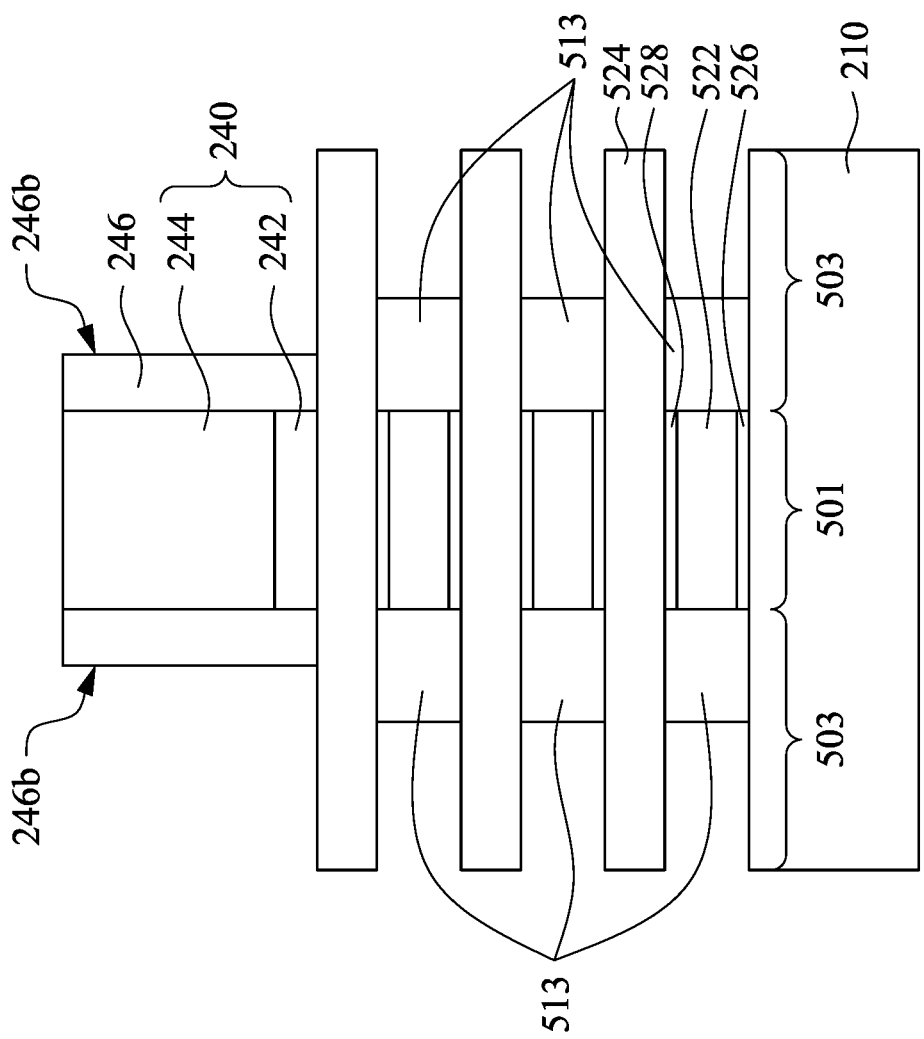
Figure 25:
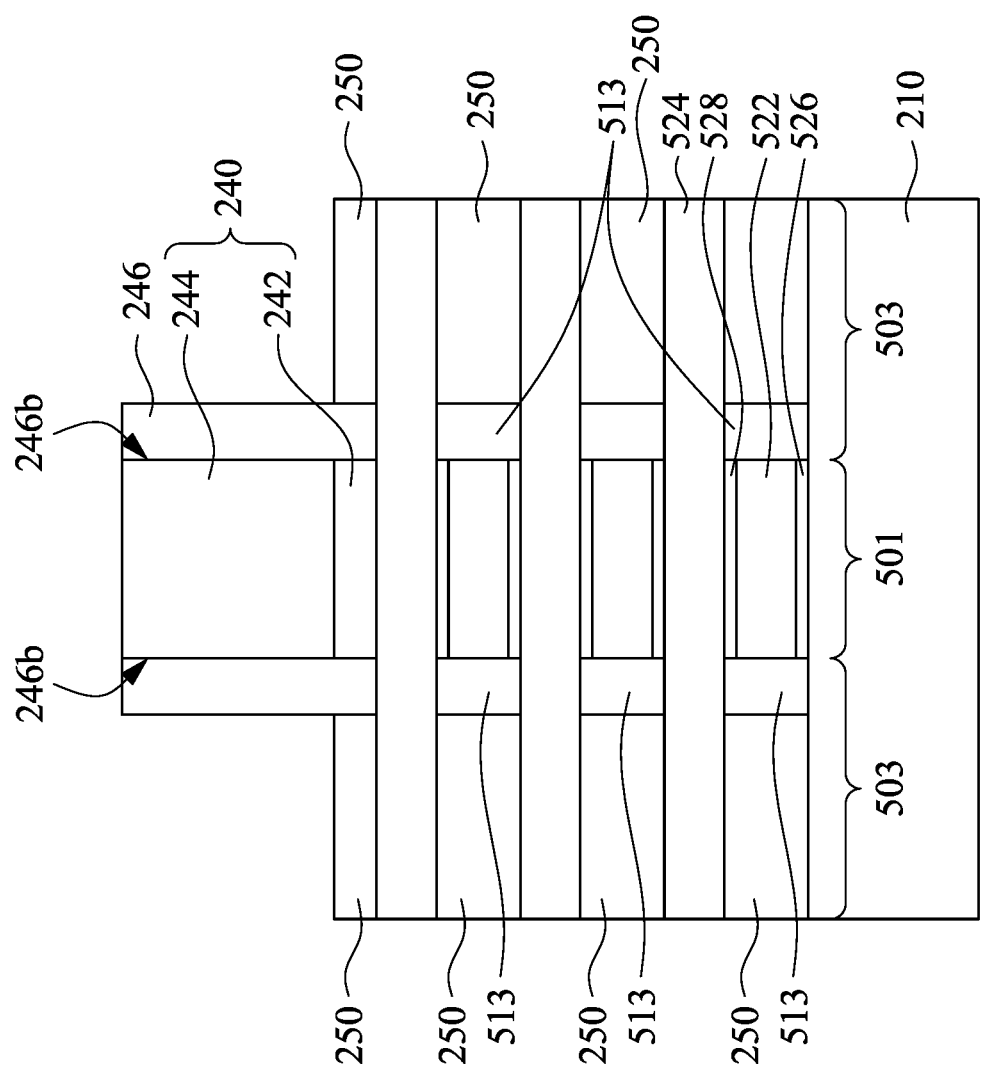
Figure 26:
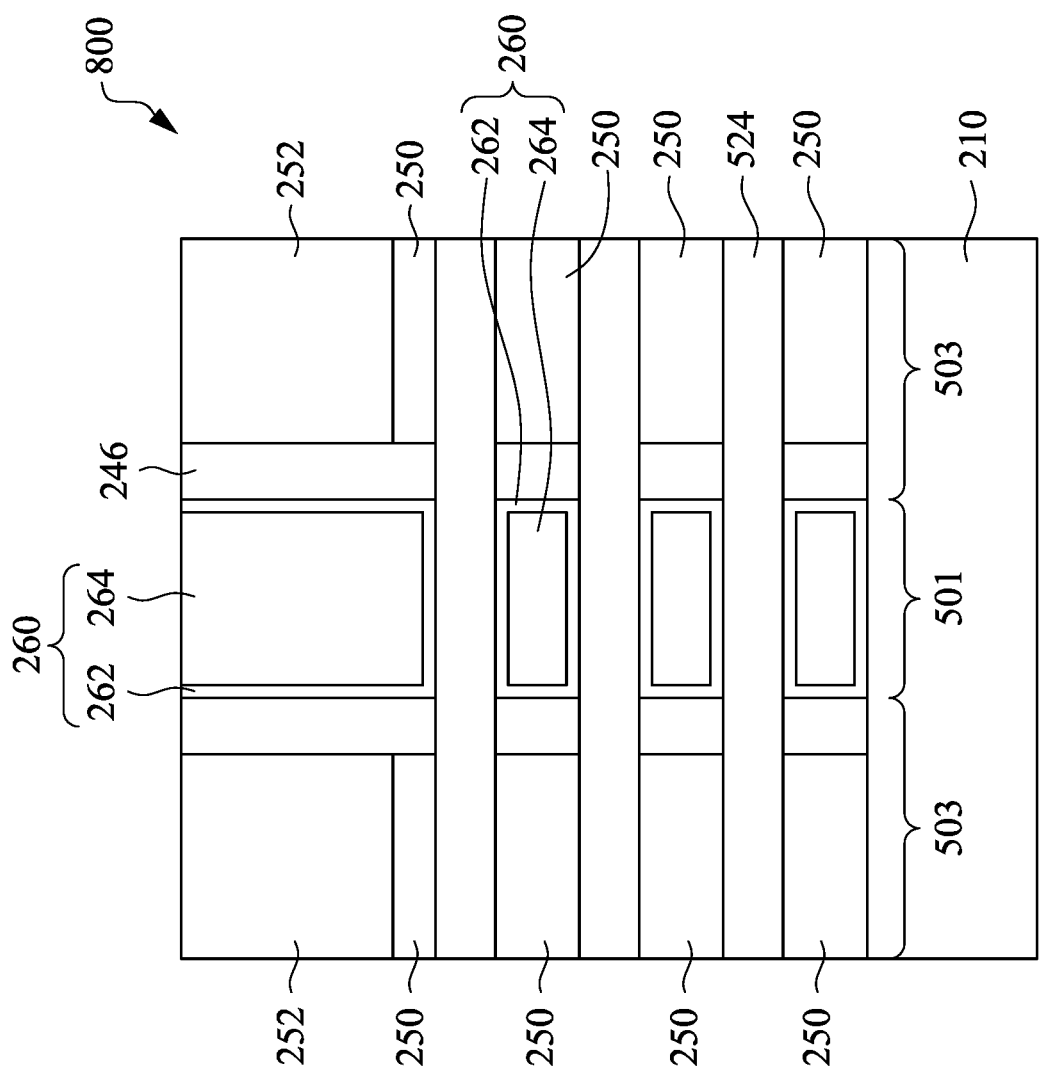

Reference is made to FIG. 24. A dielectric material 513 such as silicon nitride may be filled into the recesses 511. Please refer to FIG. 25. An etch operation may be performed to remove a portion of the dielectric material 513 such that the dielectric material 513 is directly under the spacer layer 246. The dielectric material 513 in the recesses 511 may be referred to as inner spacers. Still referring to FIG. 25, the source and drain structures 250 may be formed on the source and drain regions 503 of the fins and in the recesses 511. Then, the structure of FIG. 25 is then subjected to the operations same as FIG. 16 through FIG. 18, and a semiconductor device 800 is then formed, as shown in FIG. 26. In the semiconductor device 800, the first layer 522 of the stack 520 show in FIG. 13 is completely removed. Furthermore, the inner spacers 513 formed from the dielectric material is directly disposed under the spacer layer 246.

Although the above embodiments show a full release of the nanowires (i.e. the sacrificial layers (e.g. the first layers 222) on the channel region are completely removed), a partial release of the nanowires may be performed in other embodiments.

A semiconductor device and a method of forming the semiconductor device are provided. By using the material $ZnS_{1-x}Se_x$, $Al_{1-x}Ga_xP$, $GaP_{1-x}As_x$, $MgS_{1-x}Se_x$, or $Al_{1-x}Ga_xAs$ having a lattice constant equal to or substantially equal to a lattice constant of Si, SiGe or Ge to form the stack, the transition layer is significantly reduced, and thus the limitation caused by strain and migration of Ge atoms may be avoided, and the etch selectivity of the nanowire forming operation may efficiently increase. In addition, a portion of the material may be directly used as inner spacers of the semiconductor device, so as to reduce the parasitic capacitance of the semiconductor device (or device) due to the high band gap of the material, and thus a process of fabricating the semiconductor device may be simplified.

In accordance with some embodiments, the present disclosure discloses a method of forming a semiconductor device. In the method, a stack is formed on a substrate. The stack includes plural first epitaxial layers and plural second epitaxial layers alternatingly stacked over each other. Then, a first etching process is performed on the stack to form a fin. Next, a dielectric layer is formed over the fin. Then, a channel region of the fin is exposed. Afterwards, a second etching process is performed on a first portion of each of the first epitaxial layers in the channel region of the fin using a hydrocarbon etch chemistry. The second etching process etches the first epitaxial layers at a higher etch rate than the second etching process etches the second epitaxial layers. A gate structure is then formed around a first portion of each of the second epitaxial layers in the channel region of the fin.

In accordance with various embodiments, the present disclosure discloses a method of forming a semiconductor device. In the method, a stack is formed on a substrate. The stack includes a first buffer layer, a first epitaxial layer, a second buffer layer, and a second epitaxial layer sequentially stacked over one another. The stack is etched to form a fin. A dielectric layer is formed over the fin. A channel region of the fin is exposed. A first portion of each of the first buffer layer and the second buffer layer is etched in the channel region of the fin. A first portion of the first epitaxial layer is formed in the channel region of the fin after etching the first portion of each of the first buffer layer and the second buffer layer in the channel region of the fin. A gate structure is formed around a first portion of the second epitaxial layer in the channel region of the fin.

In accordance with some embodiments, the present disclosure discloses a semiconductor device. The semiconductor device includes a substrate, a nanowire formed of a first semiconductive material, a first buffer layer, an epitaxial layer formed of a second semiconductive material, source and drain structures and a gate structure. The nanowire having source and drain regions and a channel region between the source and drain regions. The first buffer layer is over the source and drain regions of the nanowire. The epitaxial layer is over the first buffer layer. A lattice constant of the nanowire is greater than a lattice constant of the epitaxial layer, and a lattice constant of the first buffer layer gradually increases along a direction from the epitaxial layer to the nanowire. The source and drain structures respectively adjoin the source and drain regions of the nanowire. The gate structure wraps around the channel region of the nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a stack over a substrate, wherein the stack comprises a plurality of first epitaxial layers and a plurality of second epitaxial layers alternatingly stacked over each other, and the stack further comprises a plurality of buffer layers respectively between the first and second epitaxial layers;
   performing a first etching process on the stack to form a fin;
   forming a dielectric layer over the fin;
   exposing a channel region of the fin;
   performing a second etching process on a first portion of each of the first epitaxial layers in the channel region of the fin using a hydrocarbon etch chemistry, wherein the second etching process etches the first epitaxial layers at a higher etch rate than the second etching process etches the second epitaxial layers; and
   forming a gate structure around a first portion of each of the second epitaxial layers in the channel region of the fin.

2. The method of claim 1, wherein the first epitaxial layers comprise ZnS, AlP, GaP, or combinations thereof, and the second epitaxial layers comprise silicon.

3. The method of claim 1, wherein the first epitaxial layers comprise $ZnS_{1-x}Se_x$, $GaP_{1-x}As_x$, or combinations thereof, where x is greater than 0 and smaller than 1, and the second epitaxial layers comprise SiGe.

4. The method of claim 1, wherein the first epitaxial layers comprise MgS, AlAs, ZnSe, GaAs, or combinations thereof, and the second epitaxial layers comprise germanium.

5. The method of claim 1, further comprising:
   forming a dummy gate structure across the fin prior to forming the dielectric layer;
   forming a spacer extending along sidewalls of the dummy gate structure, wherein source and drain regions of the fin are exposed after forming the spacer;
   etching second and third portions of each of the first epitaxial layers respectively in the source and drain regions of the fin; and
   epitaxially growing source and drain structures respectively around second portions and third portions of the second epitaxial layers, wherein the second portions of the second epitaxial layers are in the source region of the fin, and the third portions of the second epitaxial layers are in the drain region of the fin.

6. The method of claim 5, wherein etching the first portion of each of the first epitaxial layers is performed such that a fourth portion of each of the first epitaxial layers remains under the spacer.

7. The method of claim 1, wherein a lattice constant difference between the first epitaxial layers and the second epitaxial layers is equal to or less than about 5%.

8. A method, comprising:
   forming a stack over a substrate, wherein the stack comprises a first buffer layer, a first epitaxial layer, a second buffer layer, and a second epitaxial layer sequentially stacked over one another;

etching the stack to form a fin;

forming a dielectric layer over the fin;

exposing a channel region of the fin;

etching a first portion of each of the first buffer layer and the second buffer layer in the channel region of the fin;

etching a first portion of the first epitaxial layer in the channel region of the fin after etching the first portion of each of the first buffer layer and the second buffer layer in the channel region of the fin; and forming a gate structure around a first portion of the second epitaxial layer in the channel region of the fin.

9. The method of claim 8, wherein the first buffer layer comprises $ZnS_{1-x}Se_x$, where x is greater than or equal to 0 and smaller than or equal to 1.

10. The method of claim 8, wherein the second buffer layer comprises $ZnS_{1-x}Se_x$, where x is greater than or equal to 0 and smaller than or equal to 1.

11. The method of claim 8, wherein the first epitaxial layer comprises silicon, and the second epitaxial layer comprises germanium.

12. The method of claim 8, wherein the first epitaxial layer comprises germanium, and the second epitaxial layer comprises silicon.

13. The method of claim 8, further comprising:

forming a dummy gate structure across the fin prior to forming the dielectric layer;

forming a spacer extending along sidewalls of the dummy gate structure, wherein source and drain regions of the fin are exposed after forming the spacer;

etching second and third portions of each of the first buffer layer and the second buffer layer respectively in the source and drain regions of the fin;

etching second and third portions of the first epitaxial layer respectively in the source and drain regions of the fin after etching the second and third portions of each of the first buffer layer and the second buffer layer respectively in the source and drain regions of the fin; and epitaxially growing source and drain structures respectively around second and third portions of the second epitaxial layer, wherein the second portion of the second epitaxial layer is in the source region of the fin, and the third portion of the second epitaxial layer is in the drain region of the fin.

14. The method of claim 13, wherein etching the second and third portions of each of the first buffer layer and the second buffer layer is performed such that a fourth portion of each of the first buffer layer and the second buffer layer under the spacer is etched;

wherein etching the second and third portions of the first epitaxial layer is performed such that a fourth portion of the first epitaxial layer under the spacer is etched, wherein a recess is formed under the spacer after etching the second and third portions of the first epitaxial layer;

further comprising:

depositing a dielectric material in the recess; and etching an excess portion of the dielectric material external to the recess to form an inner spacer.

15. The method of claim 8, wherein a germanium content of the first epitaxial layer is greater than a germanium content of the second epitaxial layer, and the first buffer layer has a gradually increasing Se content from a bottom of the first buffer layer to a top of the first buffer layer.

16. The method of claim 8, wherein a germanium content of the first epitaxial layer is greater than a germanium content of the second epitaxial layer, and the second buffer layer has a gradually decreasing Se content from a bottom of the second buffer layer to a top of the second buffer layer.

17. A method, comprising:

forming a semiconductive stack over a substrate, wherein the semiconductive stack comprises a first layer, a first buffer layer on the first layer, a second layer on the first buffer layer, and a second buffer layer on the second layer;

patterning the semiconductive stack to form a fin structure over the substrate;

recessing the first layer and the first and second buffer layers of the fin structure;

forming a dielectric material on a side of the recessed first layer and the recessed first and second buffer layers;

removing the recessed first layer and the recessed first and second buffer layers after forming the dielectric material; and forming a gate structure to surround the second layer and be in contact with the dielectric material.

18. The method of claim 17, wherein the first buffer layer comprises metals.

19. The method of claim 17, wherein the recessed first and second buffer layers are removed prior to the recessed first layer.

20. The method of claim 17, wherein a lattice constant of the first buffer layer gradually decreases from a bottom of the first buffer layer to a top of the first buffer layer.

* * * * *